(12) United States Patent
Yamazaki et al.

(10) Patent No.: US 6,501,094 B1
(45) Date of Patent: Dec. 31, 2002

(54) SEMICONDUCTOR DEVICE COMPRISING A BOTTOM GATE TYPE THIN FILM TRANSISTOR

(75) Inventors: Shunpei Yamazaki, Tokyo (JP); Naoaki Yamaguchi, Kanagawa (JP); Setsuo Nakajima, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/095,026

(22) Filed: Jun. 9, 1998

(30) Foreign Application Priority Data

Jun. 11, 1997 (JP) .............................. 9-171098
Jun. 11, 1997 (JP) .............................. 9-171099

(51) Int. Cl.⁷ ..................... H01L 29/04; H01L 31/036; H01L 31/112; H01L 27/01; H01L 29/76
(52) U.S. Cl. ......................... 257/57; 257/59; 257/66; 257/72; 257/347
(58) Field of Search ....................... 257/57, 59, 66, 257/72, 347, 351; 349/46

(56) References Cited

U.S. PATENT DOCUMENTS

| | | | |
|---|---|---|---|
| 3,783,049 A | 1/1974 | Sandera | 438/543 |
| RE28,385 E | 4/1975 | Mayer | 438/58 |
| RE28,386 E | 4/1975 | Heiman et al. | 438/477 |
| 4,231,809 A | 11/1980 | Schmidt | 438/477 |
| 4,561,171 A | 12/1985 | Schlosser | 438/58 |
| 5,010,037 A | 4/1991 | Lin et al. | 117/8 |
| 5,037,774 A | 8/1991 | Yamawaki et al. | 117/8 |
| 5,075,259 A | 12/1991 | Moran | 438/655 |
| 5,147,826 A | 9/1992 | Liu et al. | 438/486 |
| 5,225,355 A | 7/1993 | Sugino et al. | 438/391 |
| 5,244,819 A | 9/1993 | Yue | 438/402 |

(List continued on next page.)

FOREIGN PATENT DOCUMENTS

| | | | |
|---|---|---|---|
| EP | 0 85 406 | 8/1983 | 257/66 |
| JP | 58-033822 | 2/1983 | 117/7 |
| JP | 58-190020 | 11/1983 | 438/FOR 242 |
| JP | 58-083993 | 5/1984 | 257/66 |
| JP | 62-033417 | 8/1987 | 117/104 |
| JP | 2-140915 | 5/1990 | 438/509 |
| JP | 63-295065 | 5/1990 | 219/130.4 |
| JP | 3-136280 | * 6/1991 | 257/57 |
| JP | 5-058789 | 3/1993 | 117/2 |
| JP | 5-109737 | 4/1993 | 438/474 |
| JP | 6-268212 | 9/1994 | 257/66 |
| JP | 07-030125 | 1/1995 | 257/66 |

OTHER PUBLICATIONS

S. Caune et al., "Combined CW Laser and Furnace Annealing of Amorphous Si and Ge in Contact with Some Metals", Applied Surface Sciences, vol. 36, (1989), pp. 597–604 (with abstract).

J.M. Green et al., "Method to Purify Semiconductor Wafers", IBM Technical Disclosure, vol. 16, No. 5, Oct. 1973, pp. 1612–1613.

S. Lee et al., "Low Temperature Poly–Si TFT Fabrication by Nickel–Induced Lateral Crystallization of Amorphous Silicon Films", Digest of Technical Papers—1995 International Workshop on Active–Matrix Liquid–Crystal Displays, Aug. 24–25, 1995, pp. 113–116.

S.F. Gong et al., "Thermodynamic Investigations of Solid–State Si–Metal Interactions.II. General Analysis of Si–Metal Binary Systems", J. Appl. Phys. vol. 68, No. 9, Nov. 1, 1990, pp. 4542–4549.

P.H. Robinson et al., "Use of HCl Gettering in Silicon Device Processing", J. Electrochem Soc., vol. 113, No. 1, Jan. 1971, pp. 141–143.

(List continued on next page.)

Primary Examiner—Steven Loke
(74) Attorney, Agent, or Firm—Eric J. Robinson; Robinson Intellectual Property Law Office, P.C.

(57) ABSTRACT

A semiconductor device includes a bottom gate type thin film transistor, wherein the bottom gate type thin film transistor is characterized in that a gate electrode is composed of a first layer comprising titanium and a second layer comprising aluminum formed on the first layer.

33 Claims, 15 Drawing Sheets

U.S. PATENT DOCUMENTS

| | | | |
|---|---|---|---|
| 5,264,383 A | 11/1993 | Young | 438/151 |
| 5,275,851 A | 1/1994 | Fonash et al. | 438/479 |
| 5,298,075 A | 3/1994 | Lagendiyk et al. | 134/2 |
| 5,300,187 A | 4/1994 | Lesk et al. | 438/477 |
| 5,352,291 A | 10/1994 | Zhang et al. | 117/8 |
| 5,403,772 A | 4/1995 | Zhang et al. | 438/166 |
| 5,422,311 A | 6/1995 | Woo | 438/655 |
| 5,426,061 A | 6/1995 | Sopori | 438/475 |
| 5,426,064 A | 6/1995 | Zhang et al. | 438/166 |
| 5,481,121 A | 1/1996 | Zhang et al. | 507/138 |
| 5,488,000 A | 1/1996 | Zhang et al. | 438/166 |
| 5,492,843 A | 2/1996 | Adachi et al. | 438/479 |
| 5,501,989 A | 3/1996 | Takayama et al. | 438/155 |
| 5,508,533 A | 4/1996 | Takemura | 256/64 |
| 5,529,937 A | 6/1996 | Zhang et al. | 438/471 |
| 5,534,716 A | 7/1996 | Takemura | 257/72 |
| 5,543,352 A | 8/1996 | Ohtani et al. | 438/487 |
| 5,563,426 A | 10/1996 | Zhang et al. | 257/66 |
| 5,569,610 A | 10/1996 | Zhang et al. | 438/166 |
| 5,569,936 A | 10/1996 | Zhang et al. | 257/66 |
| 5,580,792 A | 12/1996 | Zhang et al. | 438/166 |
| 5,585,291 A | 12/1996 | Ohtani et al. | 438/486 |
| 5,589,694 A | 12/1996 | Takayama et al. | 257/67 |
| 5,595,923 A | 1/1997 | Zhang et al. | 438/162 |
| 5,595,944 A | 1/1997 | Zhang et al. | 438/158 |
| 5,604,360 A | 2/1997 | Zhang et al. | 257/72 |
| 5,605,846 A | 2/1997 | Ohtani et al. | 438/487 |
| 5,606,179 A | 2/1997 | Yamazaki et al. | 257/59 |
| 5,608,232 A | 3/1997 | Yamazaki et al. | 257/66 |
| 5,612,250 A | 3/1997 | Ohtani et al. | 438/795 |
| 5,614,426 A | 3/1997 | Funada et al. | 438/150 |
| 5,614,733 A | 3/1997 | Zhang et al. | 257/66 |
| 5,616,506 A | 4/1997 | Takemura | 438/150 |
| 5,620,910 A | 4/1997 | Teramoto | 438/151 |
| 5,621,224 A | 4/1997 | Yamazaki et al. | 257/66 |
| 5,624,851 A | 4/1997 | Takayama et al. | 438/166 |
| 5,637,515 A | 6/1997 | Takemura | 438/162 |
| 5,639,698 A | 6/1997 | Yamazaki et al. | 438/486 |
| 5,643,826 A | 7/1997 | Ohtani et al. | 438/162 |
| 5,646,424 A | 7/1997 | Zhang et al. | 257/66 |
| 5,654,203 A | 8/1997 | Ohtani et al. | 438/97 |
| 5,656,825 A | 8/1997 | Kusumoto et al. | 257/66 |
| 5,663,077 A | 9/1997 | Adachi et al. | 438/151 |
| 5,677,549 A | 10/1997 | Takayama et al. | 257/66 |
| 5,696,386 A | 12/1997 | Yamazaki | 257/57 |
| 5,696,388 A | 12/1997 | Funada et al. | 257/64 |
| 5,700,333 A | 12/1997 | Yamazaki et al. | 136/258 |
| 5,705,829 A | 1/1998 | Miyanaga et al. | 257/66 |
| 5,712,191 A | 1/1998 | Nakajima et al. | 438/487 |
| 5,742,363 A * | 4/1998 | Bae | 349/46 |
| 5,744,822 A | 4/1998 | Takayama et al. | 257/66 |
| 5,744,824 A | 4/1998 | Kousai et al. | 257/74 |
| 5,756,364 A | 5/1998 | Tanaka et al. | 438/30 |
| 5,766,977 A | 6/1998 | Yamazaki | 438/151 |
| 5,773,327 A | 6/1998 | Yamazaki et al. | 438/154 |
| 5,773,846 A | 6/1998 | Zhang et al. | 257/66 |
| 5,773,847 A | 6/1998 | Hayakawa | 257/66 |
| 5,783,468 A | 7/1998 | Zhang et al. | 438/166 |
| 5,795,795 A | 8/1998 | Kousai et al. | 438/166 |
| 5,808,321 A | 9/1998 | Mitanaga et al. | 257/72 |
| 5,811,327 A | 9/1998 | Funai et al. | 438/166 |
| 5,814,540 A | 9/1998 | Takemura et al. | 438/166 |
| 5,818,076 A | 10/1998 | Zhang et al. | 257/255 |
| 5,821,138 A | 10/1998 | Yamazaki et al. | 438/166 |
| 5,824,573 A | 10/1998 | Zhang et al. | 438/150 |
| 5,824,574 A | 10/1998 | Yamazaki et al. | 438/150 |
| 5,825,437 A * | 10/1998 | Seo et al. | 349/46 |
| 5,830,784 A | 11/1998 | Zhang et al. | 438/166 |
| 5,837,619 A | 11/1998 | Adachi et al. | 438/795 |
| 5,840,118 A | 11/1998 | Yamazaki | 117/103 |
| 5,843,225 A | 12/1998 | Takayama et al. | 117/8 |
| 5,843,833 A | 12/1998 | Ohtani et al. | 438/486 |
| 5,851,862 A | 12/1998 | Ohtani et al. | 438/166 |
| 5,858,823 A | 1/1999 | Yamazaki et al. | 438/166 |
| 5,869,362 A | 2/1999 | Ohtani | 438/166 |
| 5,869,363 A | 2/1999 | Yamazaki et al. | 438/166 |
| 5,879,977 A | 3/1999 | Zhang et al. | 438/166 |
| 5,882,960 A | 3/1999 | Zhang et al. | 438/166 |
| 5,886,366 A | 3/1999 | Yamazaki et al. | 257/59 |
| 5,888,857 A | 3/1999 | Zhang et al. | 438/162 |
| 5,888,858 A | 3/1999 | Yamazaki et al. | 438/162 |
| 5,895,933 A | 4/1999 | Zhang et al. | 257/49 |
| 5,897,347 A | 4/1999 | Yamazaki et al. | 438/166 |
| 5,904,770 A | 5/1999 | Ohtani et al. | 117/103 |
| 5,915,174 A | 6/1999 | Yamazaki et al. | 438/166 |
| 5,923,962 A | 7/1999 | Ohtani et al. | 438/150 |
| 5,923,997 A | 7/1999 | Mitanaga et al. | 438/486 |
| 5,929,464 A | 7/1999 | Yamazaki et al. | 257/72 |
| 5,932,893 A | 8/1999 | Miyanaga et al. | 257/66 |
| 5,937,282 A | 8/1999 | Nakajima et al. | 438/149 |
| 5,940,690 A | 8/1999 | Kusumoto et al. | 438/149 |
| 5,942,768 A | 8/1999 | Zhang | 257/72 |
| 5,946,560 A | 8/1999 | Uochi et al. | 438/162 |
| 5,949,115 A | 9/1999 | Yamazaki et al. | 257/396 |
| 5,953,597 A | 9/1999 | Kusumoto et al. | 438/161 |
| 5,956,579 A | 9/1999 | Yamazaki et al. | 438/151 |
| 5,973,378 A | 10/1999 | Ohtani | |

OTHER PUBLICATIONS

Y. Kawazu et al., "Low–Temperature Crystallization of Hydrogenated Amorphous Silicon Induced by Nickel Silicide Formation", Japan Appl. Phys., vol. 29, No. 12, Dec. 1990, pp. 2698–2704.

F. Fortuna et al., "In Situ Study of Ion Beam Induced Si Crystallization from a Silicide Interface", Applied Surface Science, vol. 73, (1993), pp. 264–267.

G. Carter et al., "Ion Implantation of Semiconductors", John Wiley & Sons Inc., New York, (1976), pp. 172–173.

J.C.C. Fan et al., "Lateral Epitaxy by Seeded Solidification for Growth of Single–Crystal Si Films on Insulators", Appl. Phys. Lett., vol. 38, No. 5, Mar. 1, 1981, pp. 365–367.

S. Wolf, "Silicon Processing for the VLSI Era—vol. 2: Process Integration", Lattice Press, (cir. 1990) pp. 144–146.

S. Lee et al., "Pd Induced Lateral Crystallization of Amorphous Si Thin Films", Appl. Phys. Lett. vol. 66, No. 13, Mar. 27, 1995.

T. Hempel et al., "Needle–Like Crystallization of Ni Doped Amorphous Silicon Thin Films", Solid State Communications, vol. 85, No. 11, Mar. 1993, pp. 921–924.

A.V. Dvurechenskii et al., "Transport Phenomena in Amorphous Silicon Doped by Ion Implantation of 3d Metals", Phys. Stat. Sol. (A) 95, (1986), pp. 635–640.

C. Hayzelden et al., "In Situ transmission electron microscopy studies of silicide–mediated crystallization of amorphous silicon".

R. Kakkad et al., "Low Temperature Selective Crystallization of Amorphous Silicon", Journal of Non–Crystalline Solids, vol. 115, (1989), pp. 66–68.

G. Liu et al., "Selective area crystallization of amorphous silicon films by low–temperature rapid thermal annealing", Appl. Phys. Lett., vol. 55, No. 7, Aug. 14, 1989, pp. 660–662.

G. Liu et al., "Polycrystalline silicon thin film transistors on Corning 7059 glass substrates using short time, low–temperature processing", Appl. Phys. Lett., vol. 62, No. 20, May 17, 1993, pp. 2554–2556.

R. Kakkad et al., "Crystallized Si films by low–temperature rapid thermal annealing of amorphous silicon", Appl. Phys. Lett., vol. 65, No. 5, Mar. 1, 1989, pp. 2069–2072.

* cited by examiner

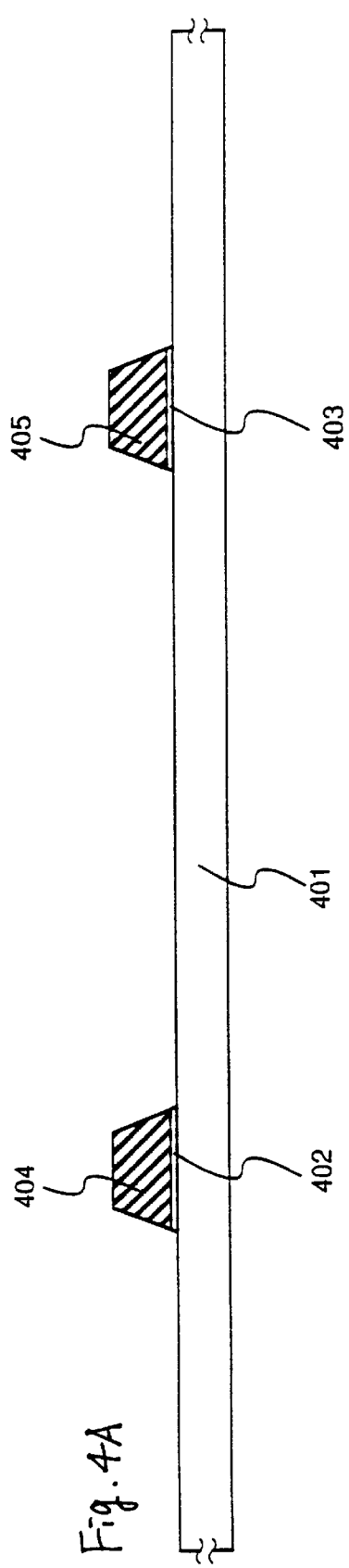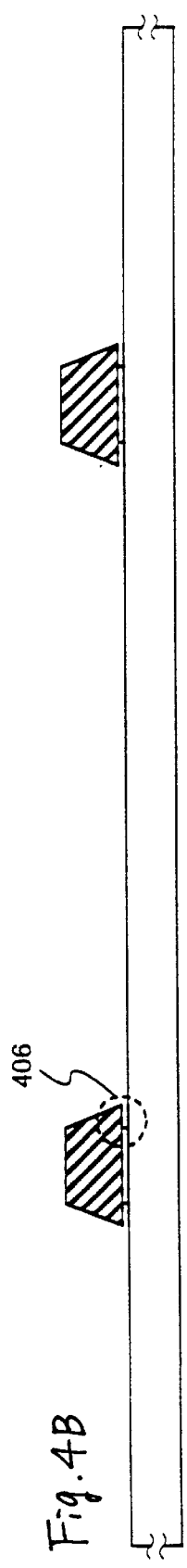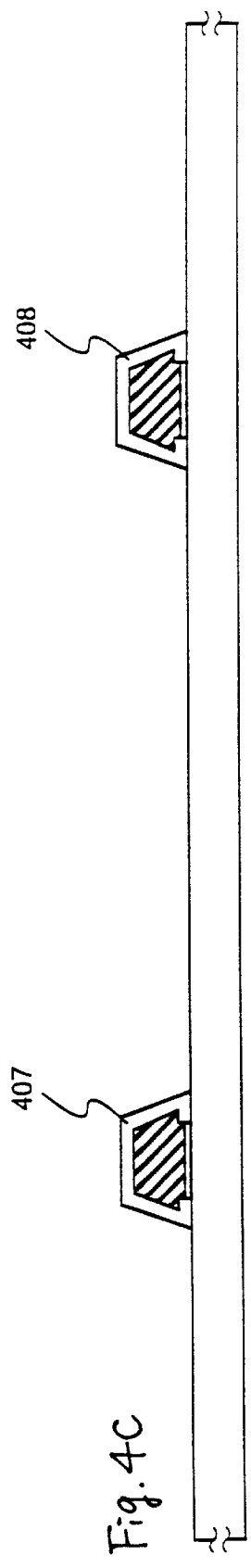

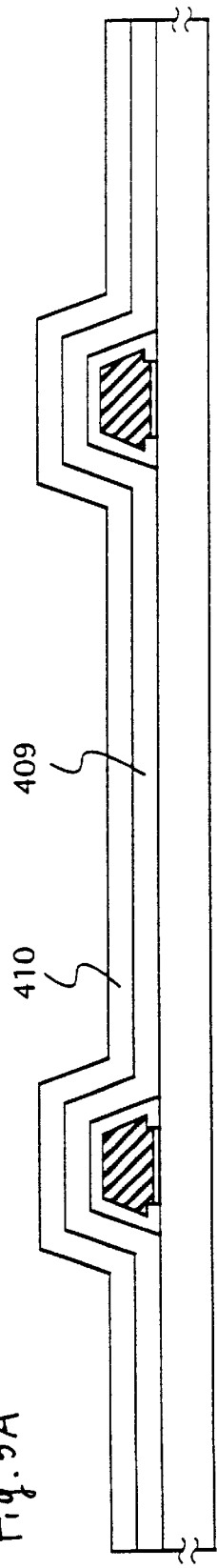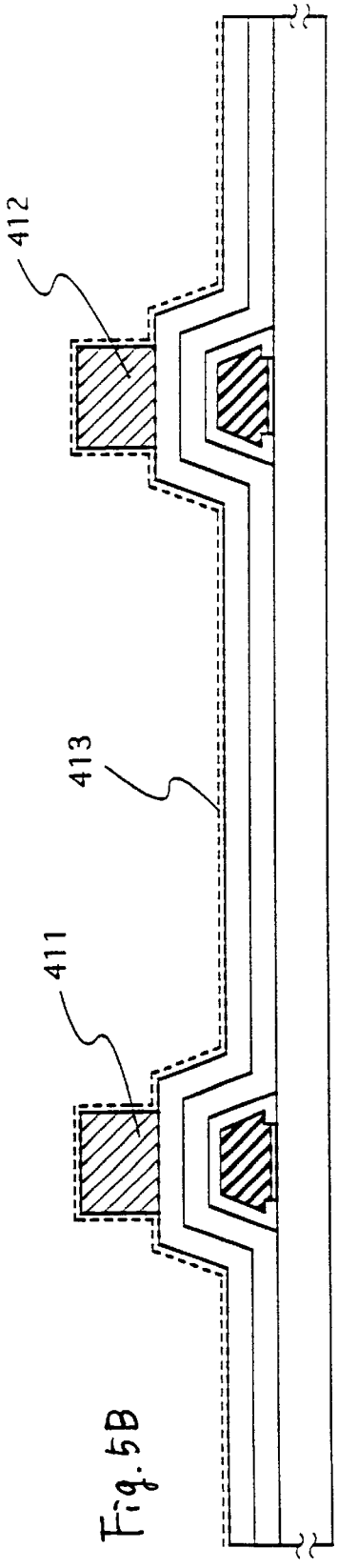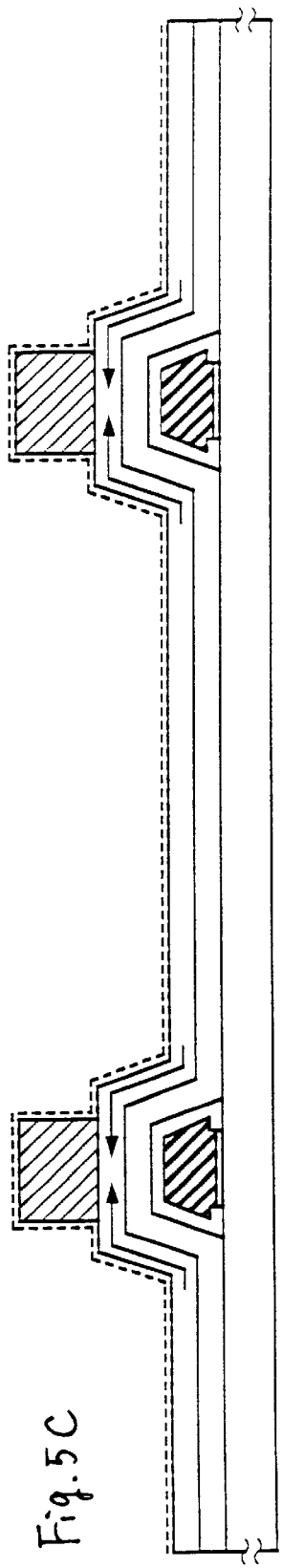

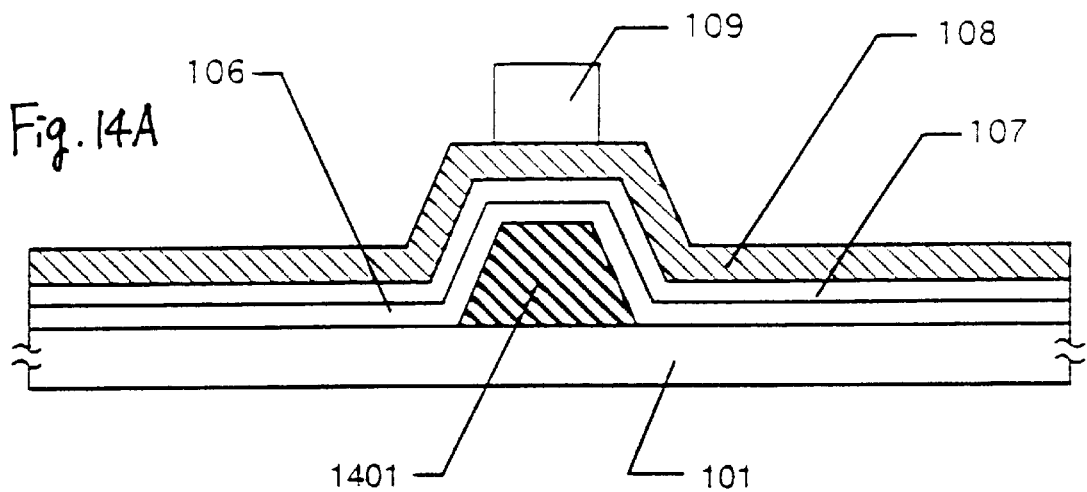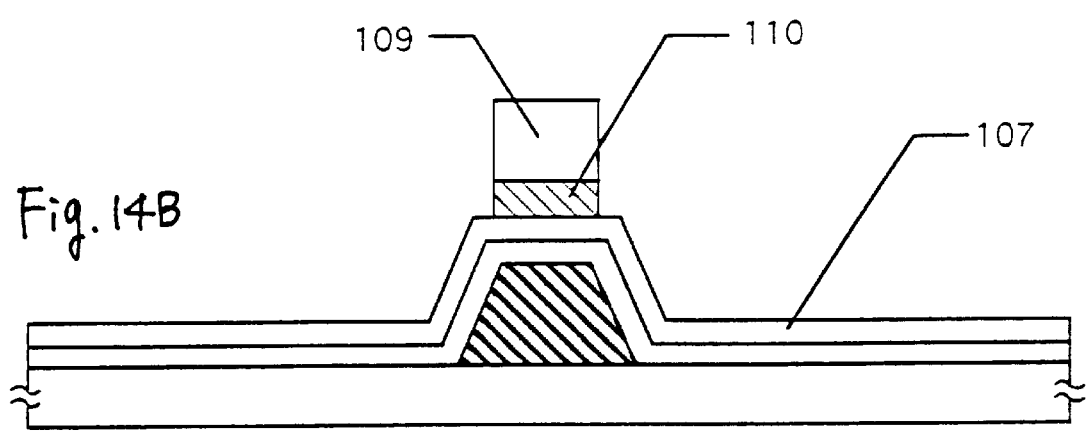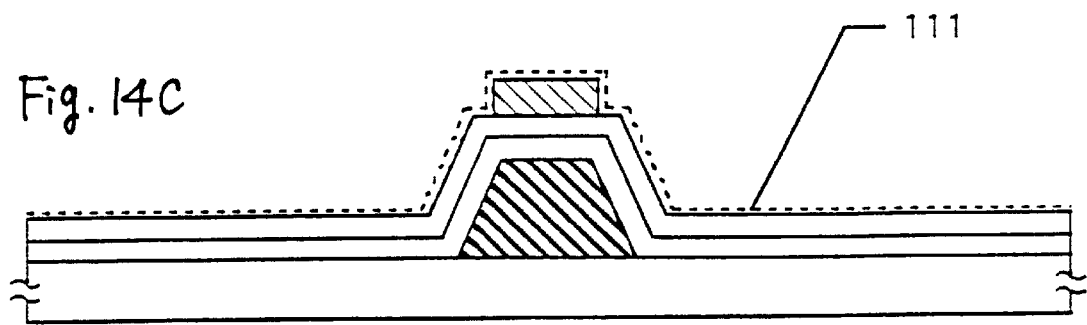

SEMICONDUCTOR DEVICE COMPRISING A BOTTOM GATE TYPE THIN FILM TRANSISTOR

FIELD OF THE INVENTION

The present invention relates to a bottom-gate-type, thin film transistor, and also to a method for producing it.

BACKGROUND OF THE INVENTION

Known are thin film transistors (hereinafter referred to as TFT) having an active layer of a silicon film formed on a glass or quartz substrate.

Various types of thin film transistors are known, of which, at present, bottom-gate-type ones are being most industrialized for practical use.

In view of their productivity, it is desirable to develop much in future bottom-gate-type TFT to which the production process in part, the designing rule and the production equipment are common.

A bottom-gate-type, thin film transistor comprises a gate electrode, a gate-insulating film and an active layer of a silicon film as formed on a substrate in that order.

As the silicon film constituting the active layer, generally used is an amorphous silicon film. However, in order to obtain TFT of higher quality, it is desirable to use a crystalline silicon film.

To obtain a crystalline silicon film, much used is a technique of crystallizing an amorphous silicon film through exposure to laser radiations.

For the crystallization, also employable is heating, which, however, does not apply to the production of bottom-gate-type TFT.

This is because, in the process for producing bottom-gate-type TFT, the heating shall follow the formation of the gate electrode, by which the gate electrode material will diffuse unfavorably.

However, from the viewpoint of the quality of the crystalline silicon film produced and of the process of producing the film, heating is preferred to laser irradiation.

As the material of the gate electrode, most preferred is aluminum with low resistance.

However, the electrode material of aluminum is problematic in that it will diffuse, as being influenced by the heating of the active layer for crystallization and activation, to often form projections of so-called hillocks and whiskers.

In particular, in the production of bottom-gate-type TFT, the gate electrode is first formed and thereafter the active layer is formed thereon. In this, therefore, the influence of heat on the layers to be formed in different steps is often problematic.

SUMMARY OF THE INVENTION

The subject matter of the present invention disclosed herein is to provide a constitution of a bottom-gate-type TFT having an active layer of a crystalline silicon film.

It is also to provide a novel constitution of a bottom-gate-type TFT having a gate electrode comprising aluminum.

Specifically, the subject matter of the invention is to provide a constitution of a bottom-gate-type TFT having a gate electrode of an aluminum material and having an active layer of a crystalline silicon film.

One aspect of the invention disclosed herein is a semiconductor device, which comprises;

a gate electrode, a gate-insulating film as formed over said gate electrode, and an active layer of a crystalline silicon film as formed on said gate-insulating film, and is characterized in that;

said active layer is so constituted that the crystal growth therein extends from the source and drain regions to the channel-forming region, and said source and drain regions contain a higher concentration of a metal element capable of promoting the crystallization of silicon than said channel-forming region.

In that constitution, the metal element capable of promoting the crystallization of silicon is most preferably nickel.

Apart from nickel, the metal element may be selected from Fe, Co, Ru, Rh, Pd, Os, Ir, Pt, Cu and Au.

In place of the crystalline silicon film, employable is a compound film of silicon and germanium.

Another aspect of the invention is a method for producing a semiconductor device, comprising;

a step of forming a gate electrode on a substrate, a step of forming a gate-insulating film on said gate electrode, a step of forming an amorphous silicon film on said gate-insulating film, a step of forming a mask on said amorphous silicon film above said gate electrode, a step of introducing a metal element capable of promoting the crystallization of silicon, into said amorphous silicon film via said mask, a step of heating the thus-layered substrate to induce crystal growth in said amorphous silicon film in the direction from the region into which said metal element has been introduced to the region below said mask, a step of doping phosphorus into the region into which said metal element has been introduced, via said mask, and a step of again heating the substrate to thereby concentrate said metal element in said phosphorus-doped region.

The invention disclosed herein is characterized in that the gate electrode has a laminate structure composed of a thin titanium film and a thick aluminum film, and that the aluminum film constituting the gate electrode is subjected to anodic oxidation.

In the process of producing the device having the constitution noted above, the layered substrate is heated prior to forming the oxide film through anodic oxidation to thereby intentionally make the aluminum film have projections of so-called hillocks and whiskers on its surface. This is to prevent the formation any other projections on the surface of the aluminum film in the subsequent steps.

In the process, in addition, the heating induces the crystallization of the aluminum film due to the action of the titanium film, thereby retarding the formation of hillocks and whiskers on the surface of the aluminum film in the subsequent steps.

Therefore, the constitution noted above is advantageous in that, even when the layered substrate is heated in the subsequent steps, aluminum elements constituting the aluminum film do not diffuse into any other films, or the aluminum film is not melted to flow out anywhere, or hillocks and whiskers are not formed on the surface of the aluminum film.

It is important to side-etch the titanium film and to fill the side-etched region with the aluminum oxide as formed through anodic oxidation. This is because the aluminum diffusion and melt flow to be caused by the heating occurs essentially in the interfacial boundary between the aluminum pattern and the substrate below the pattern.

The constitution of the invention disclosed herein is extremely useful in bottom-gate-type TFT in which the active layer is made of a crystalline silicon film. This is because the process of producing such bottom-gate-type TFT requires a step of forming the crystalline silicon film after the formation of the gate electrode.

In the invention disclosed herein, aluminum can be used to form the gate electrode, and the substrate having an aluminum pattern to be the gate electrode formed thereon can be heated.

Another aspect of the invention disclosed herein is a semiconductor device, which comprises;
   a gate electrode of a laminate film composed of a titanium film and an aluminum film,
   and is characterized in that;
   said titanium film is side-etched via the mask of said aluminum film, and
   said aluminum film is subjected to anodic oxidation to form an oxide film on its surface.

Still another aspect of the invention is a semiconductor device provided with a thin film transistor, which comprises;
   a gate electrode of a laminate film composed of a titanium film and an aluminum film,
   and is characterized in that;
   said titanium film is side-etched via the mask of said aluminum film, and
   said aluminum film is subjected to anodic oxidation to form an oxide film on its surface.

In those constitutions noted above, the aluminum film may contain impurities.

In those, the side-etched region of the titanium film is filled with the anodic oxide film of aluminum.

Still another aspect of the invention is a method for producing a semiconductor device, comprising;
   a step of forming a pattern of a laminate film composed of a titanium film and an aluminum film,
   a step of side-etching said titanium film,
   a step of forming an oxide film on the surface of said aluminum film through anodic oxidation,
   a step of forming an amorphous silicon film above said pattern, and
   a step of crystallizing said amorphous silicon film under heat.

Still another aspect of the invention is a method for producing a semiconductor device, comprising;
   a step of forming a pattern of a laminate film composed of a titanium film and an aluminum film,
   a step of side-etching said titanium film,
   a step of intentionally forming projections on the surface of said aluminum film under heat,
   a step of forming an oxide film on the surface of said aluminum film through anodic oxidation,
   a step of forming an amorphous silicon film above said pattern, and
   a step of crystallizing said amorphous silicon film under heat.

In those constitutions, the heating may be effected in a heating furnace. It may also be attained through exposure to strong radiations.

The heating temperature is preferably not lower than 500° C. to produce better results in the invention.

In the invention, it is desirable to use aluminum having an extremely high purity. Using aluminum having a higher purity retards the formation of hillocks and whiskers on the surface of the aluminum film.

In order to retard the formation of hillocks and whiskers, impurities may be added to the aluminum film in an amount not larger than a few % by weight. The impurities include, for example, Si, Sc, Ti and Y, and even other elements selected from lanthanides and actinides.

BRIEF DESCRIPTION OF THE DRAWINGS

FIG. 4(A) to FIG. 4(C),

FIG. 5(A) to FIG. 5(C),

FIG. 14(A) to FIG. 14(C), and

DETAILED DESCRIPTION OF THE PREFERRED EMBODIMENT

Preferred embodiments of the invention are described below, with reference to the drawings attached hereto.

As illustrated, a pattern to be a gate electrode, which is a laminate of a titanium film 102 and an aluminum film 103, is formed on a glass substrate 101. (FIG. 1(A))

Figure 1A:
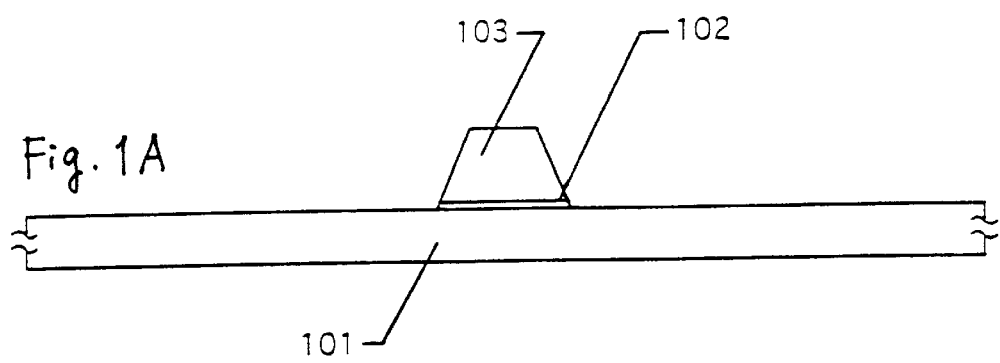
FIG. 1(A) to FIG. 1(D)
Figure 1B:
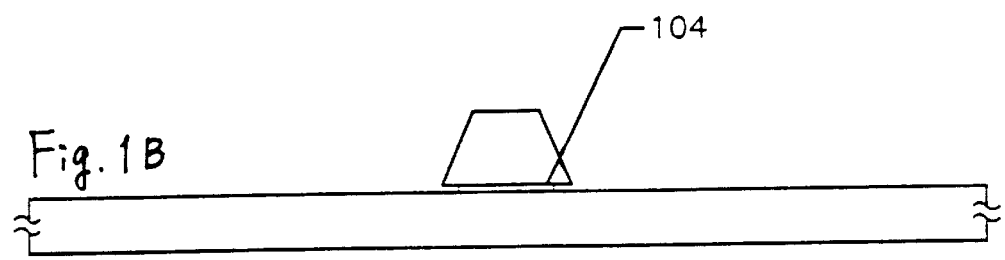

Next, the titanium film 102 is side-etched, as so indicated by 104 (FIG. 1(B)).

This is to fill the side-etched region with an oxide film to be formed through anodic oxidation in the subsequent step. As being so side-etched, the anodic oxidation of the aluminum pattern can extend to the bottom edge of the pattern.

Next, the thus-layered substrate is heated to intentionally form hillocks and whiskers on the surface of the aluminum pattern 103. The heating induces abnormal growth of aluminum to give those projections. This is effective for retarding the formation of any other hillocks and whiskers in the subsequent steps.

The formation of hillocks and whiskers results from the non-uniform distribution of aluminum atoms in the aluminum film and from the residual stress of the film. Accordingly, the formation of hillocks and whiskers around the aluminum film by previously heating the film retards the formation any further hillocks and whiskers therearound in the subsequent steps.

Figure 1C:
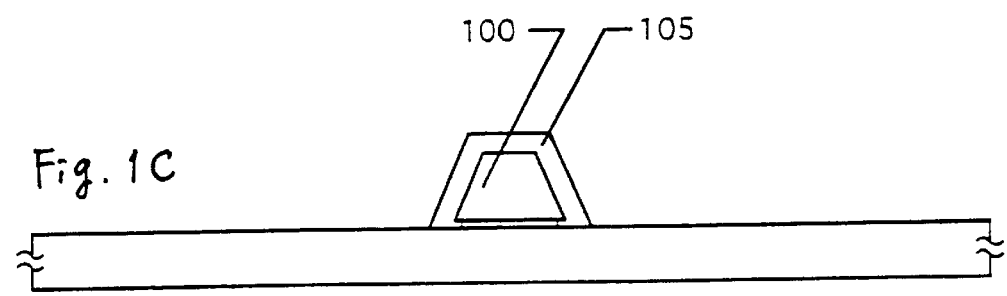

Next, the aluminum pattern 103, which acts as an anode, is subjected to anodic oxidation to form an oxide film 105 thereon, as in FIG. 1(C). In this step, the anodic oxidation extends to the bottom edge of the aluminum pattern 103 (at which the titanium film 102 was side-etched in the previous step of FIG. 1(B)).

Figure 1D:
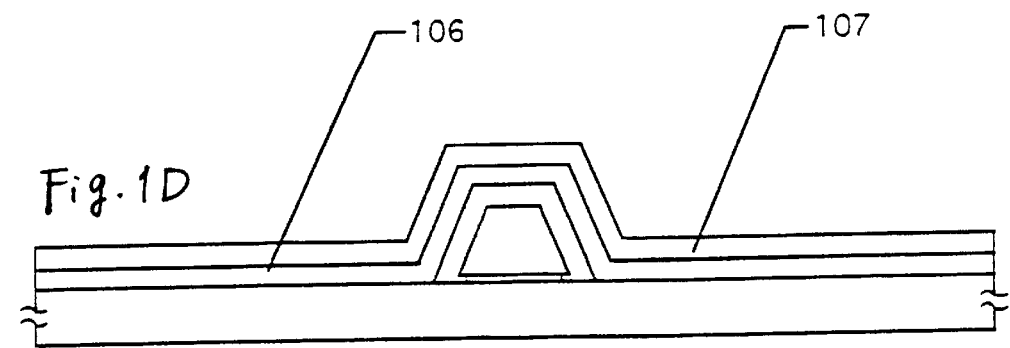

Next, as in FIG. 1(D), a gate-insulating film 106 and an amorphous silicon film 107 are formed.

Figure 2A:
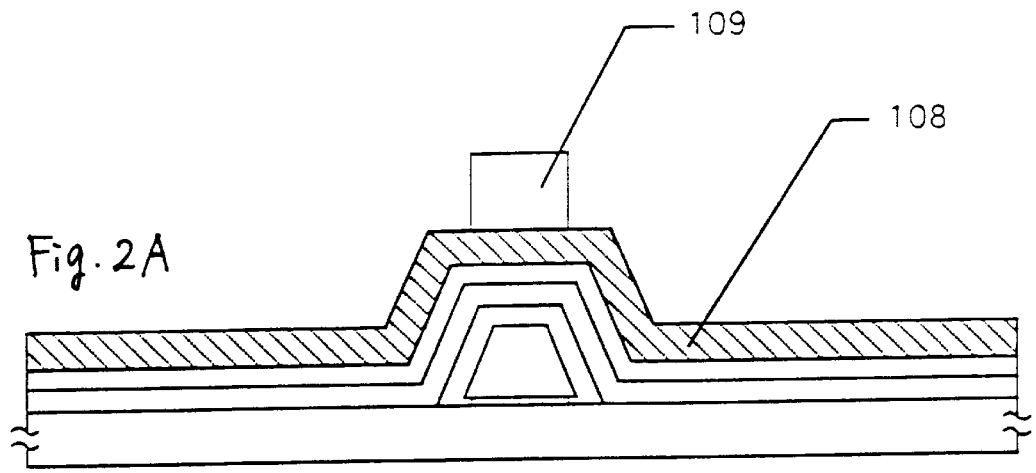
FIG. 2(A) to FIG. 2(C)
Figure 2B:
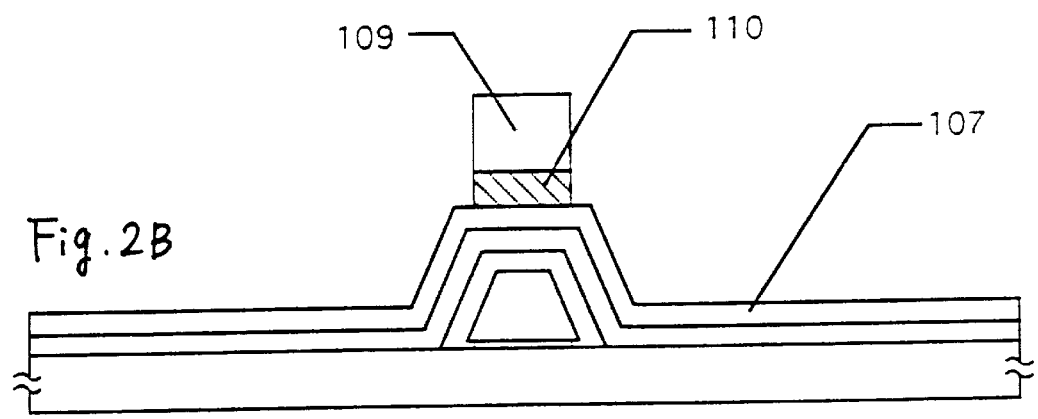
Figure 2C:
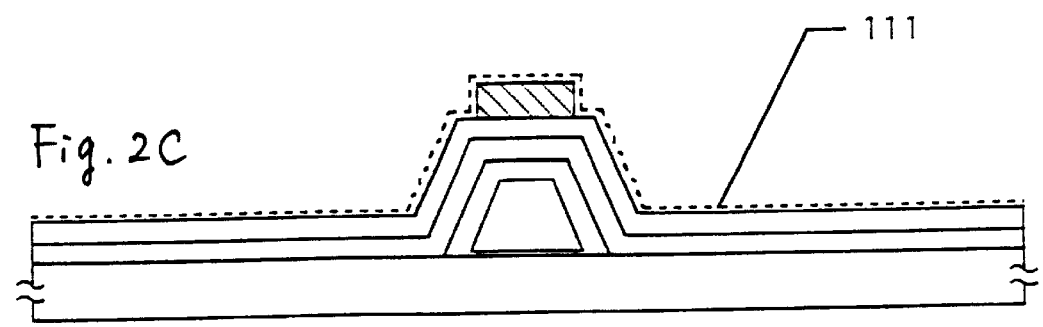

Next, as in FIG. 2(B), formed is a mask 110 of a silicon oxide film. Then, nickel is applied to the layered substrate to thereby make nickel kept in contact with the surface, as so indicated by 111.

Next, the amorphous silicon film 107 is crystallized under heat. In this step, the crystal growth starts from the left-side and right-side regions that are contacted with nickel, and meets to form a grain boundary at the site indicated by 112, as in FIG. 3(A).

This crystal growth is referred to as lateral crystal growth, which gives a crystal structure continuing in the direction of the crystal growth. In the crystal structure of that type, the movement of carriers in the crystal growth direction is hardly influenced by crystal defects or crystal level spacing.

Concretely, by aligning the axis of the crystal growth direction with that of the carrier movement direction in TFT operation, the degree of carrier movement can be increased. For example, according to this technique, it is easy to obtain N-channel TFT having a high degree of carrier movement of 100 $cm^2$/Vs or higher.

Where a large number of TFT are formed on one and the same substrate, the channel-forming region in each TFT shall always have a grain boundary at the site indicated by 112, by which the plural TFT are prevented from having ununified characteristics.

In this process, an oxide film is formed as in FIG. 1(C), prior to the crystallization of silicon under heat. In the heating step in this process, therefore, the aluminum film is prevented from being melted to flow out anywhere and aluminum atoms in the film are also prevented from diffusing to any other layers. Accordingly, the heat resistance of the semiconductor device comprising the aluminum electrode is improved.

Now, the invention is described in more detail with reference to the following Examples, which, however, are not intended to restrict the scope of the invention.

EXAMPLE 1

FIG. 1(A) to FIG. 1(D), FIG. 2(A) to FIG. 2(C), and FIG. 3(A) to FIG. 3(D) are referred to, which show the process of this example. First formed is a gate electrode on the glass substrate 101.

As the substrate, also usable is a quartz substrate, or a semiconductor or metal substrate having an insulating film formed thereon. The substrate of that group will be generically referred to as a substrate having an insulating surface.

In this, first, a titanium film is formed on a glass substrate through sputtering to have a thickness of 20 nm, and then an aluminum film containing 0.2% by weight of titanium is formed on the titanium film also through sputtering to have a thickness of 400 nm.

Next, the laminate film of the titanium film and the aluminum film is patterned to obtain the laminate pattern as in FIG. 1(A). The laminate pattern is composed of the titanium film pattern 102 and the aluminum film pattern 103.

To obtain this pattern, used is dry etching as combined with taper etching. The combined etching gives the laminate pattern, of which the cross section is tapered, as illustrated.

Next, this is heated in an inert atmosphere at 400° C. for 1 hour. This heating produces the following results.

(1) Crystallization of aluminum due to the action of the titanium film.

(2) Intentional formation of hillocks and whiskers on the surface of the aluminum film.

(1) enriches the crystal structure of aluminum, and is effective for preventing the formation of hillocks and whiskers in the subsequent steps. In addition, it is also effective for increasing the heat resistance of the gate electrode formed herein.

As in (2), hillocks and whiskers are formed in this stage, whereby any further hillocks and whiskers are prevented from being formed in the subsequent steps.

One factor of forming hillocks and whiskers is based on the intrinsic stress of aluminum and the non-uniform composition of the aluminum film. As so mentioned hereinabove, the hillocks and whiskers once formed around the aluminum film act to reduce the residual stress and the non-uniform composition of the aluminum film.

Next, the titanium film pattern 102 is selectively side-etched according to a wet etching method. After having been thus side-etched, the area of the cross section of the titanium film is reduced to give a reduced titanium film pattern 104. (FIG. 1(B))

Next, the aluminum film pattern 103 acting as an anode is subjected to anodic oxidation to form an oxide film 105 around the exposed surface of the aluminum pattern. (FIG. 1(C))

The anodic oxidation in this step extends outside and inside the aluminum pattern. The oxide film is also formed on the side-etched site of the titanium film, which is thus filled with the aluminum oxide film.

A gate electrode 100 is formed in that manner. In this step, the aluminum oxide film formed through anodic oxidation shall have an overall grown length of 100 nm.

The gate electrode may be made of titanium nitride, tantalum nitride, a laminate of tantalum and tantalum nitride, or a laminate of a tungsten silicide layer and an N-type silicon layer.

After having obtained the condition of FIG. 1(C), a silicon oxide film 106 that shall be a gate-insulating film is formed, as in FIG. 1(D). The film 106 may be formed through plasma CVD to have a thickness of 500 nm. In this step, it is to be noted that the laminate film of the silicon oxide film 106 and the oxide film 105 shall be the gate-insulating film.

Next, an amorphous silicon film 107 is formed to have a thickness of 50 nm, through thermal reduced-pressure CVD. (FIG. 1(D))

Next, a silicon oxide film 108 is formed to have a thickness of 150 nm through plasma CVD, and then a resist mask 109 is formed. (FIG. 2(A))

The resist mask 109 is formed by exposing the back surface of the substrate to light, in which the gate electrode pattern acts as a mask for the light exposure. The formation of the resist mask 109 is effected in a self-aligning manner, and therefore does not require any additional mask.

Next, as in FIG. 2(B), the silicon oxide film 108 is patterned via the resist mask 109. Thus is obtained a pattern 110 of the silicon oxide film.

After having obtained the condition of FIG. 2(B), a nickel acetate solution having a controlled nickel concentration of 10 ppm by weight is applied to the layered substrate in such a manner that nickel is kept in contact with the surface of the layered structure. (FIG. 2(C))

In that condition, nickel is not contacted with the surface of the amorphous silicon film 108 in the region coated with the mask 110 of the silicon oxide film, but is contacted with the other region. (FIG. 2(C))

To introduce nickel, employed is any of CVD, sputtering, ion implantation, gas adsorption, plasma processing or the like.

As the metal element capable of promoting the crystallization of silicon, nickel is the best. Apart from nickel, however, also employable is an element selected from Fe, Co, Ru, Rh, Pd, Os, Ir, Pt, Cu and Au.

In that condition, the thus-layered substrate is heated in a nitrogen atmosphere at 550° C. for 4 hours. The heating may be effected in a heating furnace equipped with a resistance heater.

As a result of this heating treatment, the amorphous silicon film is crystallized by the action of the nickel element. In this step, nickel diffuses in the direction as indicated by the arrows in FIG. 3(A), while promoting the crystallization of silicon.

At the site indicated by 112, the crystal growth extending from the both sides meets to form a grain boundary.

In that manner, the region of the amorphous silicon film with which nickel is kept in contact is crystallized, and the crystal growth extends from that region to the other region not contacted with nickel.

In crystallization of that manner, the grain boundary is always formed in the middle of the region indicated by 112, which is therefore effective for preventing a plurality of elements, if formed on the substrate, from having ununified characteristics. In other words, all the plural elements formed on one and the same substrate could have the same and unified characteristics owing to that grain boundary formed in each element.

Figure 3A:
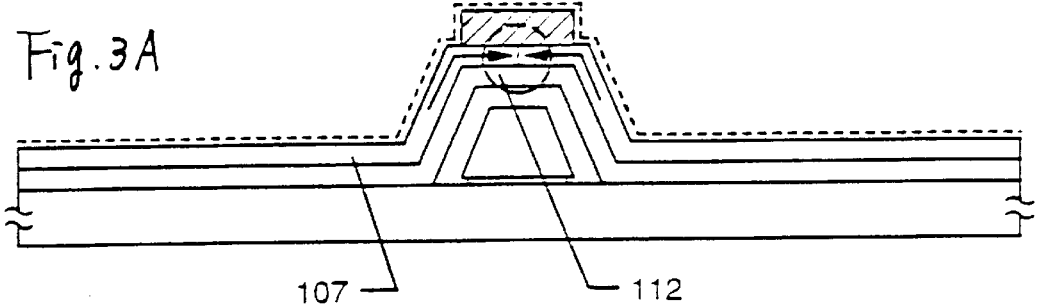
FIG. 3(A) to FIG. 3(D) show a process for producing an N-channel TFT.
Figure 3B:
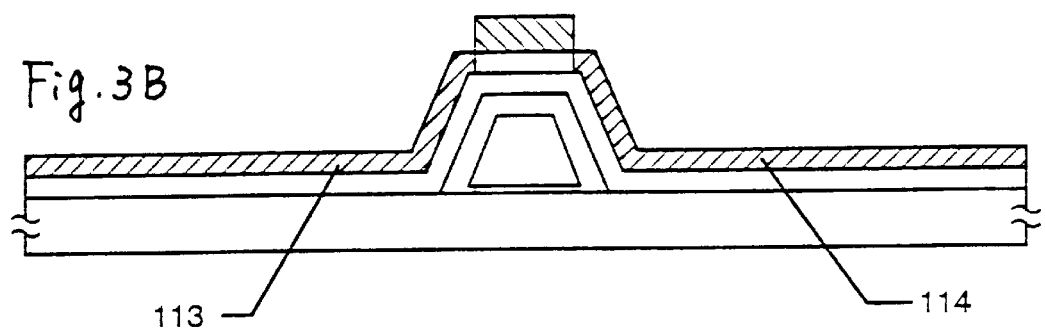

Next, as in FIG. 3(B), phosphorus is doped under the condition that the doped regions shall be source and drain regions.

For the phosphorus doping, employed is a means of plasma doping or ion implantation.

In this step, phosphorus is doped into the exposed silicon film. That is, phosphorus is doped into the regions 113 and 114, as in FIG. 3(B).

Next, the thus-layered substrate is heated in a nitrogen atmosphere at 550° C. for 2 hours. In this step, nickel moves from the region 115 to the regions 113 and 114 along the arrows illustrated. Thus, nickel having existed in the region 115 is gettered away into the regions 113 and 114. (FIG. 3(C))

In this step, it is desirable that the heating is effected at a temperature falling between 500° C. and 650° C. This is because, if the heating temperature is lower than the defined range, the nickel diffusion will be poor, but if higher than the same, aluminum could not be resistant to the heating.

Phosphorus and nickel having bonded to each other give various forms of NiP, NiP$_2$ and Ni$_2$P, and the bonding in those compounds is extremely stable. The compounds have a melting point of 900° C. or higher.

The phosphorus diffusion requires a temperature not lower than 800° C. or so.

Accordingly, in this heating step, nickel moves actively and bonds to phosphorus to give passivated nickel-phosphorus compounds. (FIG. 3(C))

The resulting nickel-phosphorus compounds do not decompose and phosphorus moves nowhere, resulting in that nickel is stably gettered by phosphorus.

In other words, as a result of the heat treatment, the nickel concentration in the region 115 is reduced, while that in the regions 113 and 114 is increased.

The region 115 from which nickel has been gettered, or that is, from which nickel has been removed shall be the channel region of the TFT to be produced herein.

On the other hand, the regions 113 and 114 in which nickel has been gettered, or that is, in which nickel has concentrated shall be the source and drain regions of the TFT. The region 115 is a channel-forming region. (FIG. 3(C))

Next, a metallic laminate (not shown) composed of titanium/aluminum/titanium films is formed by sputtering. Regarding the thickness of each film to be formed by sputtering, the titanium film shall have a thickness of 100 nm and the aluminum a thickness of 400 nm.

Next, this metallic laminate is patterned to give a source electrode 116 and a drain electrode 117. Then, the exposed semiconductor film is patterned via the masks of those patterned metal electrodes to obtain the condition of FIG. 3(D).

In that manner, completed is an N-channel TFT. On the other hand, if a P-channel TFT is desired to be produced, the doped phosphorus is canceled after the heat treatment in the step of FIG. 3(C), and thereafter boron is doped to give P-type regions 113 and 114.

For this, the regions 113 and 114 are inverted to P-type regions after the gettering step.

If desired, the regions 113 and 114 may be inverted to P-type regions before the gettering step.

The basic experiments which we, the present inventors made have verified that the boron doping at a higher dose into the region into which phosphorus was doped does not retard the gettering effect but rather enhances it.

EXAMPLE 2

This is to demonstrate a modification of Example 1 in which the heat treatment in the step of FIG. 3(A) was effected in a heating furnace. In this example, a heating means of so-called RTA, exposure to strong radiations, is employed for the heat treatment.

In RTA, infrared rays having been radiated by a lamp are focused on a mirror, and applied to the layered substrate, whereby the region having exposed to the focused rays is heated at a temperature falling between 600° C. and 800° C. within a short period of time.

This heat treatment utilizes the phenomenon that the region exposed to light absorbs the light. In this, therefore, the exposed region can be heated within a short period of time, and the heat treatment of the region can be finished within such a short period of time. Concretely, the heat treatment for about 1 to 10 minutes or so produces the crystallization, as in FIG. 3(A).

If desired, the heat treatment in Example 1 may be combined with RTA, lamp exposure, in this Example 2.

EXAMPLE 3

This is to demonstrate another modification of Example 1. In this example, a photo-mask is used in the step of forming the resist mask 109 in FIG. 2(A).

The process of this example has the disadvantage of requiring an increased number of masks, but has the advantage of employing conventional photolithography using a photo-mask, and the process is stable.

EXAMPLE 4

This is to demonstrate still another modification of Example 1. The means of crystallization employed herein is different from that in Example 1.

In this example, nickel is introduced into the entire surface of the amorphous silicon film 107 in the absence of the mask 110 in the step of FIG. 2(B).

In this case, there occurs no specific crystal growth (lateral crystal growth) such as that in FIG. 3(A). Namely, no lateral crystal growth starts from any specific region herein.

In this case, the crystal growth starts locally throughout the entire surface of the film.

EXAMPLE 5

This is to demonstrate still another modification of Example 1. In this example, boron (B) is added to the amorphous silicon film 107 being formed in the step of FIG. 1(D) in order to control the threshold value of the TFT to be produced herein.

In this case, a minor amount of diborane ($B_2H_6$) is added to the raw material gas from which the amorphous silicon film 107 is formed.

In this, any of plasma doping or ion implantation is employable for the doping.

EXAMPLE 6

This is to demonstrate still another modification of Example 1. In this example, a germanium-containing, amorphous silicon film (which comprises silicon as the essential ingredient) is formed in place of the amorphous silicon film 107.

The amorphous silicon film comprising silicon as the essential ingredient and additionally containing germanium may be represented by $Si_xGe_{1-x}$ (0.5<x<1).

In this example, the film shall contain germanium in an amount of 5 atm.%. Depending on its amount, germanium that exists in the amorphous silicon film controls the threshold value of the TFT produced herein.

To form the germanium-containing, amorphous silicon film, a raw material gas comprised of silane and germane is used for plasma CVD, thermal reduced-pressure CVD or sputtering.

EXAMPLE 7

This is to demonstrate a process for producing a combination of a P-channel TFT and an N-channel TFT. This process illustrated herein is applicable, for example, to the production of CMOS circuits.

The process of this example is illustrated in FIG. 4(A) to FIG. 4(C), FIG. 5(A) to FIG. 5(C), FIG. 6(A) and FIG. 6(B), FIG. 7, FIG. 8, and FIG. 9. First, as in FIG. 4(A), a gate electrode comprised of a titanium film pattern 402 and an aluminum film pattern 404 is formed on a glass substrate 401, along with a gate electrode comprised of a titanium film pattern 403 and an aluminum film pattern 405.

In this, the left-handed one shall be the gate electrode of the P-channel TFT, while the right-handed one shall be the gate electrode of the N-channel TFT. In that manner, the P-channel TFT is formed in the left and the N-channel TFT is in the right.

Thus is obtained the condition shown in FIG. 4(A). Next, the titanium film patterns 402 and 403 are side-etched via the masks of the aluminum film patterns 404 and 405.

In this step, the both titanium film patterns are side-etched below the bottom edge of each aluminum film pattern, as indicated by 406 in FIG. 4(B).

Next, the aluminum film patterns 404 and 405, acting as anodes, are subjected to anodic oxidation to obtain the condition of FIG. 4(C). In this, 407 and 408 are oxide films formed through the anodic oxidation.

As in FIG. 4(C), the oxide films both extend to the bottom edge of each aluminum film pattern. In this drawing, the anodic oxidation at the bottom edge of each aluminum film pattern, at which the titanium film was etched, exaggerated in some degree.

Next, as in FIG. 5(A), a silicon oxide film 409 is formed through plasma CVD. Then, an amorphous silicon film 410 is formed through thermal reduced-pressure CVD.

Next, the back surface of the glass substrate is exposed to light to form silicon oxide film patterns 411 and 412. Then, a nickel acetate solution is applied to the thus-layered substrate to thereby make nickel kept in contact with the surface of the layered structure, as so indicated by 413. (FIG. 5(B))

Next, this is heated in a nitrogen atmosphere at 550° C. for 4 hours, whereby the amorphous silicon film is crystallized.

This crystallization brings about the crystal growth as indicated by the arrows in FIG. 5(C). For this, preferably, the heating temperature falls between 500° C. and 600° C. This is because aluminum could not be resistant to temperatures higher than the defined range. However, the crystallization could not be attained at temperatures lower than the defined range.

Next, phosphorus is doped under the condition that the doped regions shall be the source and drain regions of the N-channel TFT to be produced herein.

Figure 6A:
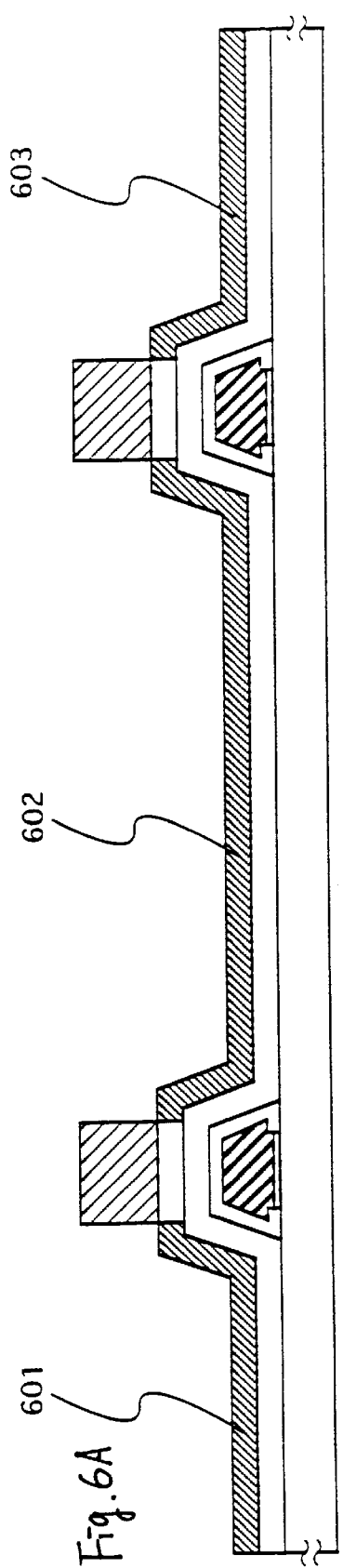
FIG. 6(A) and FIG. 6(B)

In this step, phosphorus is doped into the regions 601, 602 and 603, as in FIG. 6(A).

Figure 6B:
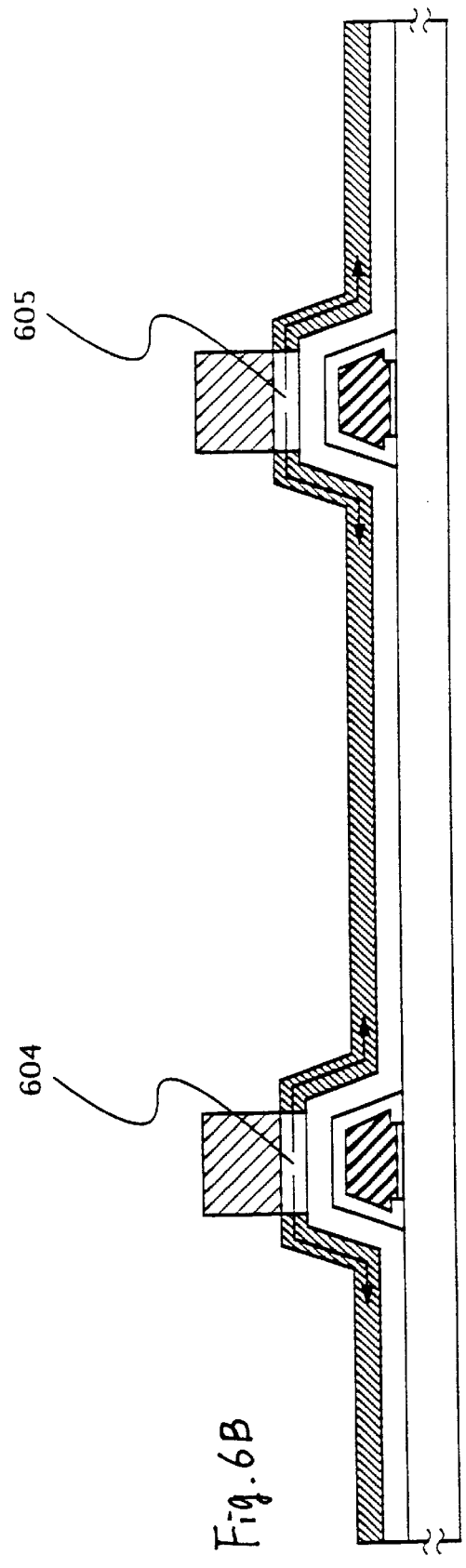

Next, the thus-layered substrate is heated in a nitrogen atmosphere at 600° C. for 1 hour. In this step, nickel moves from the regions 604 and 605 to the phosphorus-doped regions 601, 602 and 603. FIG. 6(B))

Thus, nickel having existed in the regions 604 and 605 is gettered away into the regions 601, 602 and 603.

The regions 604 and 605 shall be the channel-forming regions of TFT being produced herein.

Figure 7:
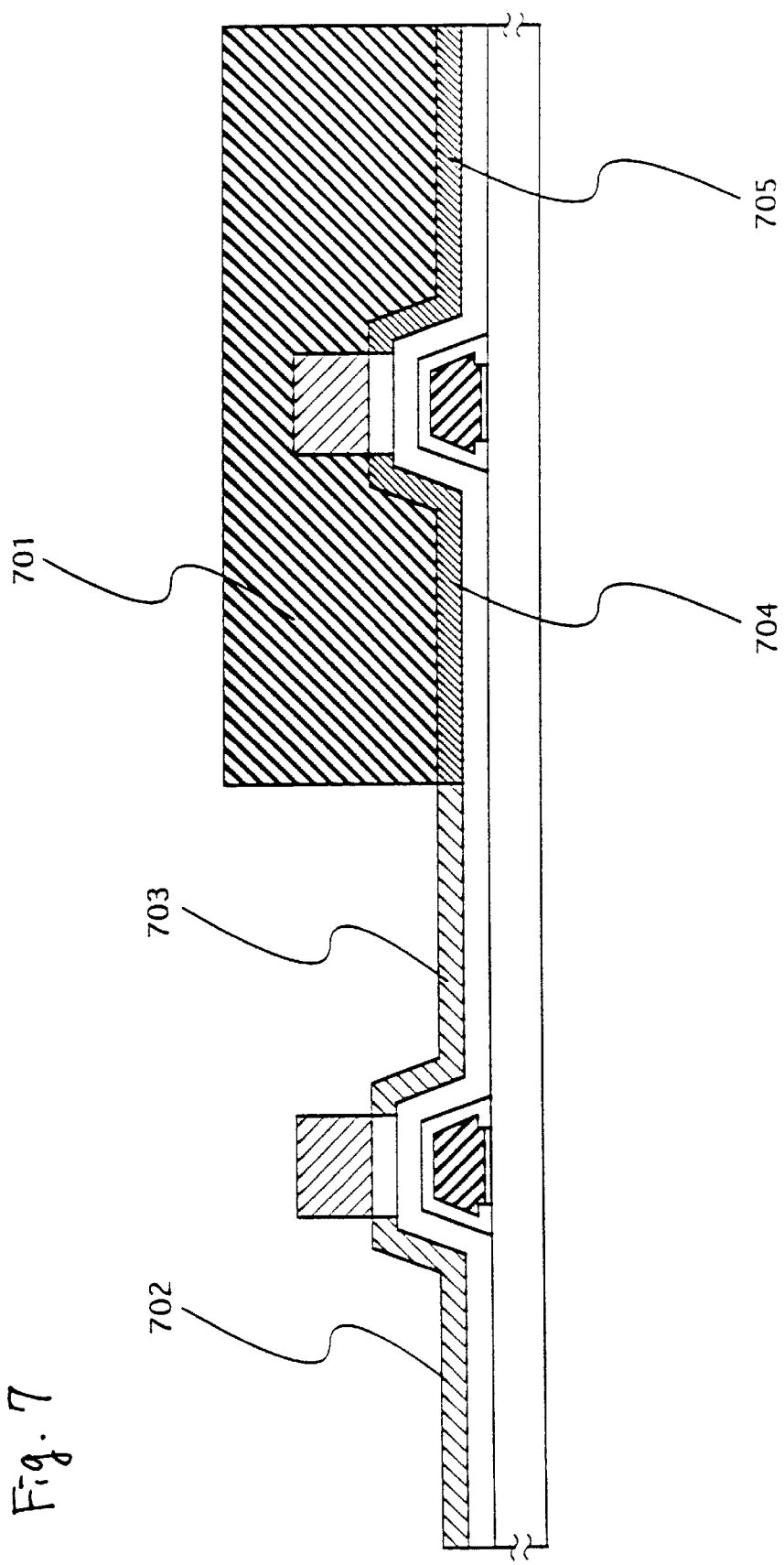
FIG. 7.

Next, a resist mask 701 is formed, as in FIG. 7. In this condition, boron is doped. In the left-handed TFT site, boron is doped over the previously phosphorus-doped region. Precisely, in the regions 702 and 703, boron is doped over the previously doped phosphorus.

This boron doping is effected under the condition that it cancels the influence of the previously doped phosphorus on those regions 702 and 703 to thereby produce P-type conductivity. As a result of this boron doping, the N-type regions produced by the previous phosphorus doping (in the step of FIG. 6(A)) are inverted into P-type regions.

After the doping, the resist mask 701 is removed. Then, the layered substrate is exposed to laser rays, thereby annealing the damage in the doped regions and activating the dopant. This step may be effected by exposure to strong radiations.

In that manner, formed are the P-type regions 702 and 703, and N-type regions 704 and 705.

The P-type regions 702 and 703 have been doped with phosphorus and with boron thereover. In those regions, boron acts to determine the conductivity of those regions, while phosphorus functions to getter nickel.

On the other hand, in the N-type regions 704 and 705, phosphorus acts to determine the conductivity of those regions and also to getter nickel.

In FIG. 7, the P-type region 702 shall be the source region of the P-channel TFT, while the region 703 shall be the drain region thereof.

The N-type region 704 shall be the drain region of the N-channel TFT, while the region 705 shall be the source region thereof.

Figure 8:
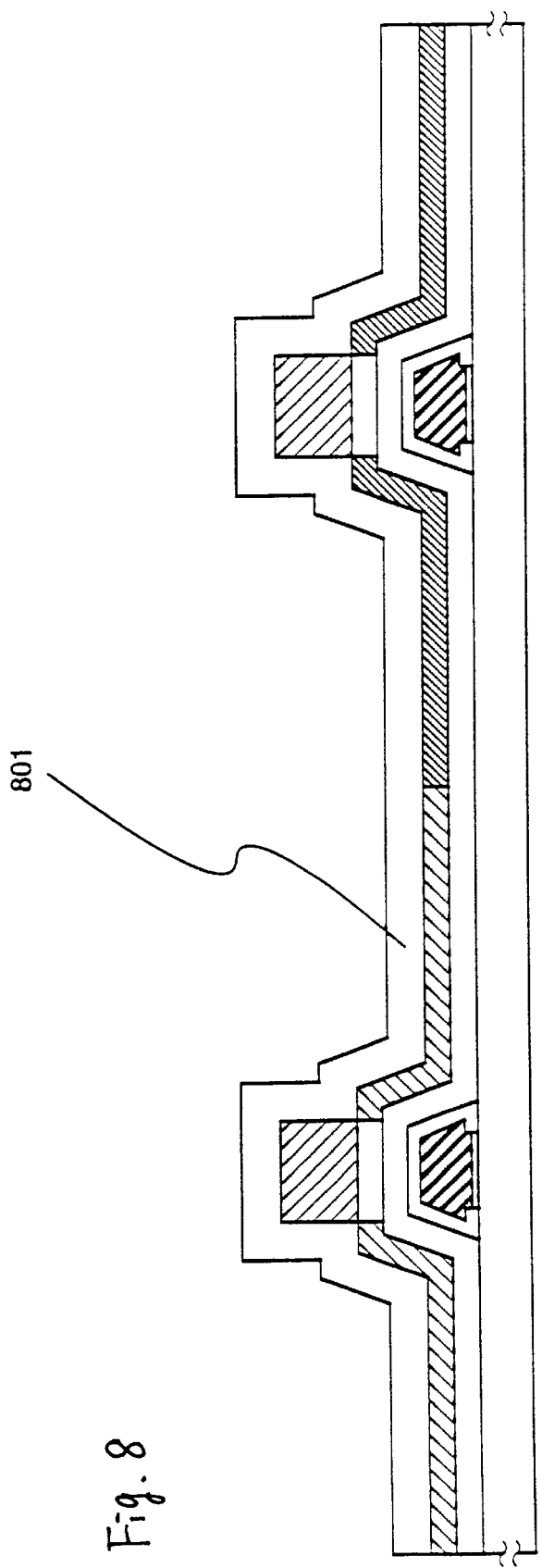
FIG. 8.

Next, as in FIG. 8, a metal film 801 is formed through sputtering over the layered substrate. This metal film 801 is of a laminate of titanium/aluminum/titanium films.

Figure 9:
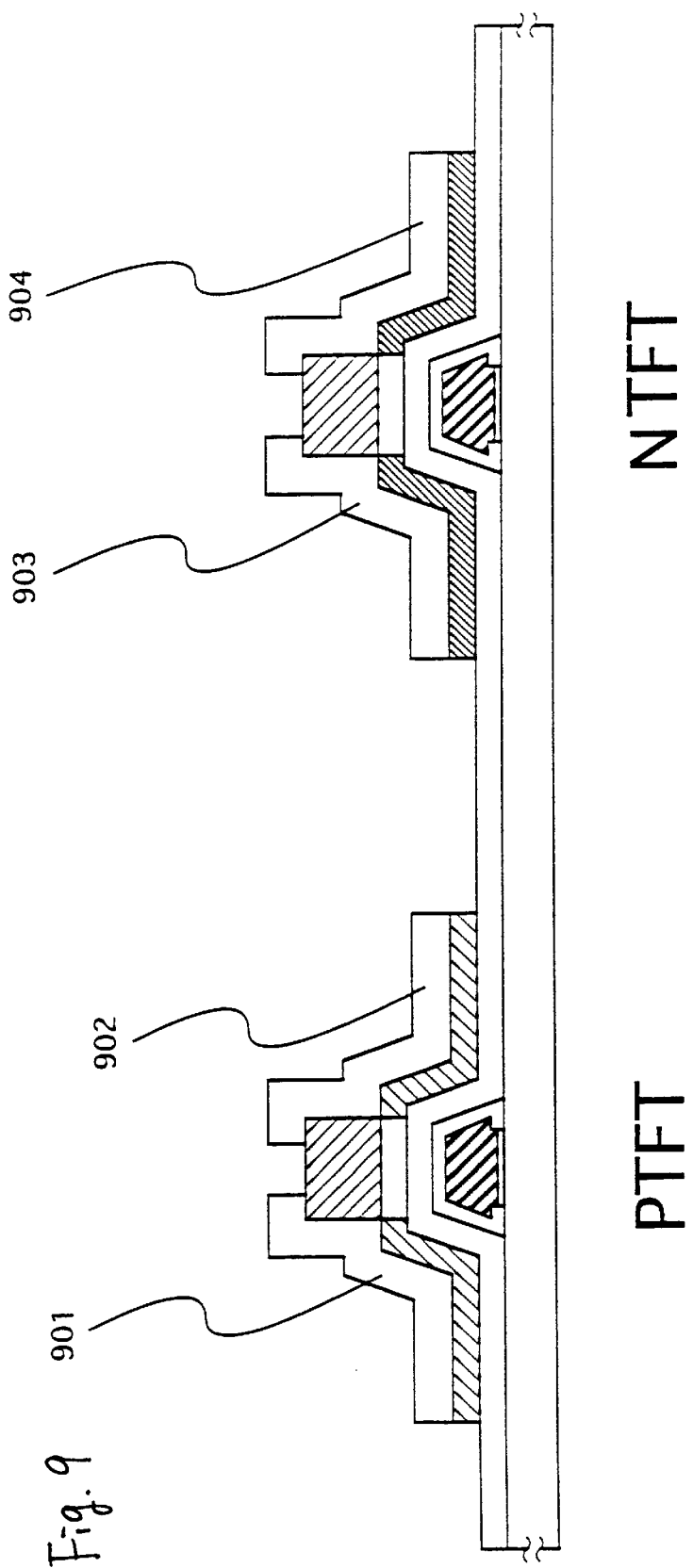
FIG. 9 show a process for producing a combination of a P-channel TFT and an N-channel TFT.

Next, as in FIG. 9, the metal film 801 is patterned to give patterns 901, 902, 903 and 904.

In this, 901 is the source electrode of the P-channel TFT, and 902 is the drain electrode thereof.

903 is the drain electrode of the N-channel TFT, and 904 is the source electrode thereof.

After having formed the electrodes 901 to 904 from the metal film 801, the exposed silicon film (for the source and drain regions of each TFT) is etched. In that manner, formed is a combination of a P-channel TFT (hereinafter referred to as P-channel TFT) and an N-channel TFT (hereinafter referred to as N-channel TFT) on one and the same substrate, as in FIG. 9.

EXAMPLE 8

This is to demonstrate a modification of Example 7. This example is characterized in that the regions constituting the P-channel TFT are doped with phosphorus for gettering and with boron for conductivity determination (that is, for channel determination), and that the regions constituting the N-channel TFT are doped with phosphorus for gettering and for conductivity determination and are heated for gettering.

Figure 10A:
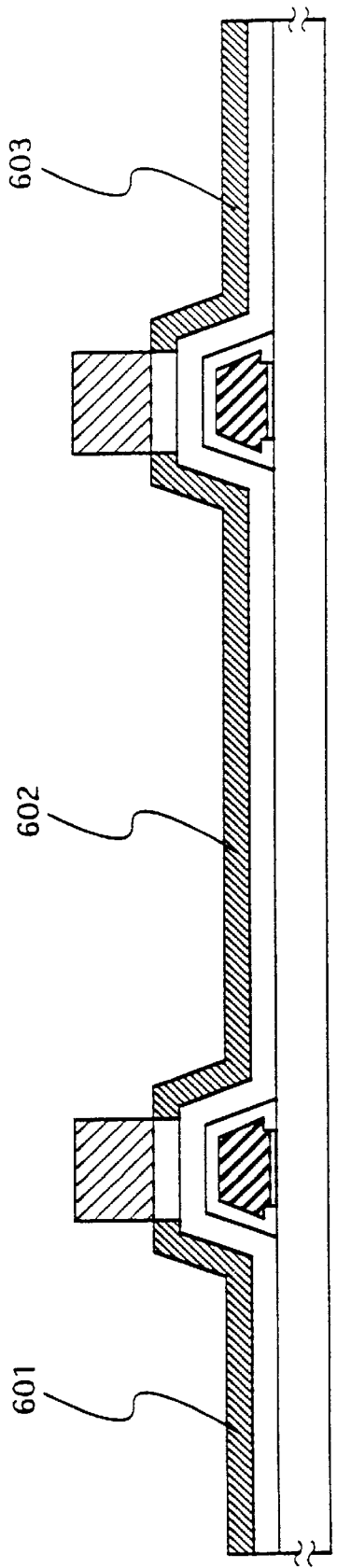
FIG. 10(A), FIG. 10(B)

First, obtained is the condition of FIG. 6(A) according to the process of Example 7. This is shown in FIG. 10(A). In this stage, the regions 601, 602 and 603, except the others to be the channel regions, have been doped with phosphorus.

Next, a resist mask 701 is formed, with which the region to be the N-channel TFT is masked. (FIG. 10(B))

Then, boron is doped under the condition that the N-type regions 702 and 703 are inverted to P-type ones. In other words, the boron doping is effected under the condition that it cancels the influence of the previously doped phosphorus on those regions 702 and 703 to thereby exhibit the influence of the thus-doped boron on those regions 702 and 703.

As a result of this boron doping, obtained are P-type regions 702 and 703. Also obtained are N-type regions 704 and 705.

After the doping, the resist mask 701 is removed. Then, the layered substrate is exposed to laser rays, thereby annealing the damage in the doped regions and activating the dopant.

This step may be effected by exposure to infrared rays from an infrared lamp (RTA).

In this example, nickel having been used for crystallization is not gettered after the step of doping the dopant to determine the conductivity of the source and drain regions in the P-channel and N-channel TFT, but is gettered after the step of doping the dopant (boron) to determine the conductivity of the source and drain regions in the N-channel TFT.

Figure 10B:
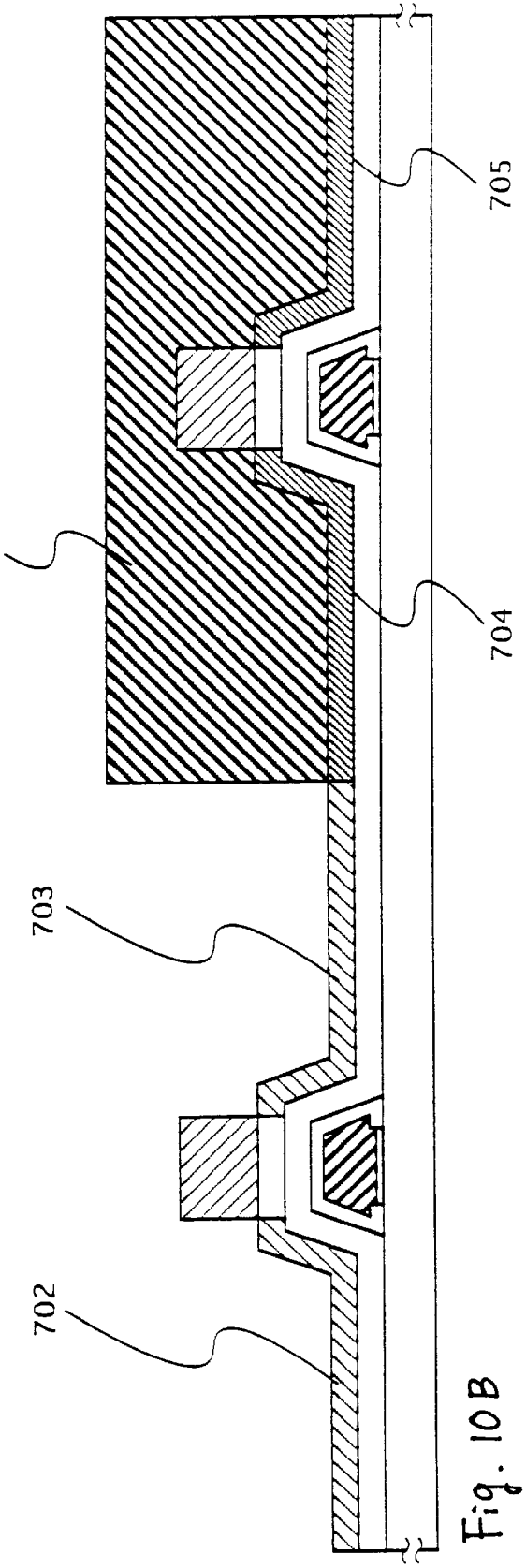

After the step of FIG. 10(B), the resist mask 701 is removed, and the doped regions are then annealed. Next, the thus-layered substrate is heated at 550° C. for 1 hour to thereby getter nickel.

Figure 11:
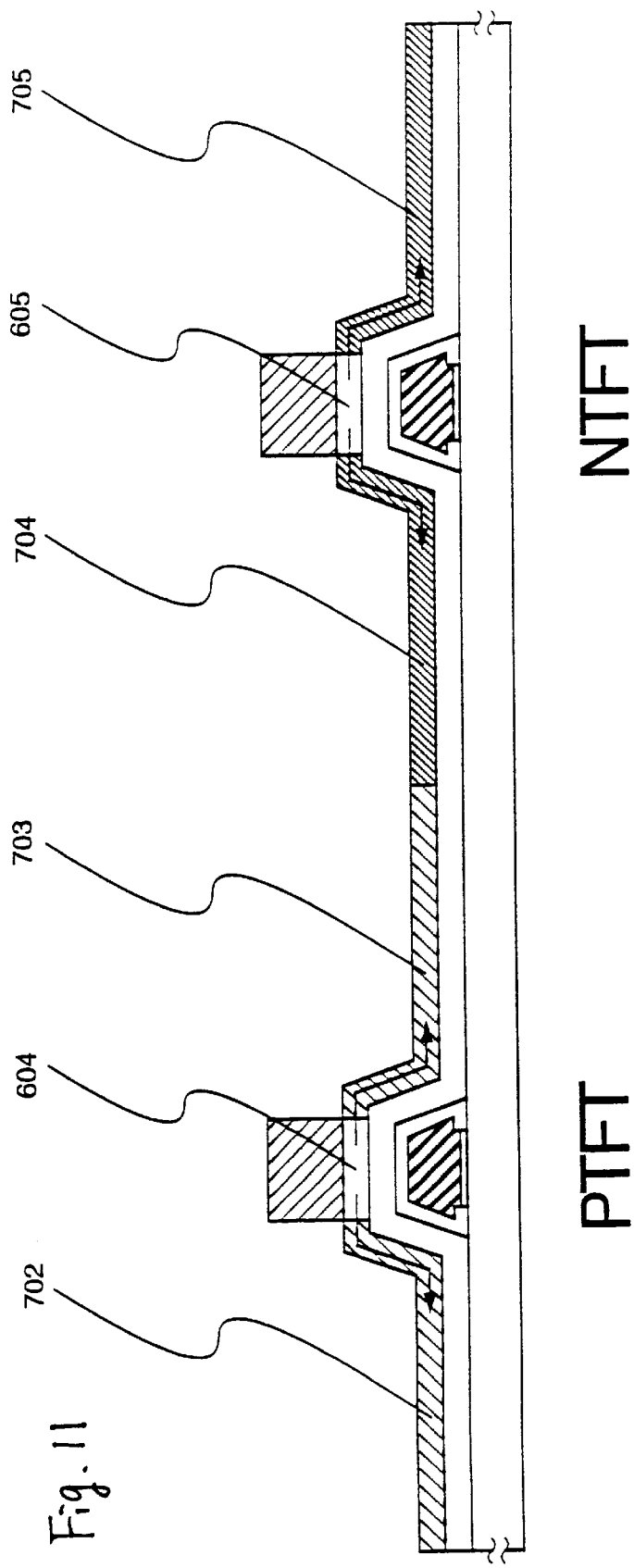
FIG. 11 show a process for producing a combination of a P-channel TFT and an N-channel TFT.

Precisely, as in FIG. 11, nickel having existed in the region 604, which shall be the channel region, is gettered away into the regions 702 and 703, and nickel having existed in the region 605, which shall be the channel region, is also gettered away into the regions 704 and 705.

In this, the regions 702 and 703 have been doped with phosphorus and then with boron thereover. In those regions in that condition, nickel is gettered more highly than in the other regions 704 and 705 which have been doped with phosphorus only.

In the basic experiments which we, the present inventors made, nickel was not gettered at all in the regions doped with boron only, but was gettered more highly in the regions doped with phosphorus and boron than in the regions doped with phosphorus only. At present, the reason for those phenomena is not clear.

In that manner, obtained are the source region 702, the channel-forming region 604 and the drain region 703 for the P-channel TFT (PTFT). In this, nickel having existed in the channel region 604 is gettered away into the source region 702 and the drain region 703, resulting in that the nickel concentration in the channel region 604 is lowered.

Also obtained are the source region 705, the channel-forming region 605 and the drain region 704 for the N-channel TFT (NTFT). In this, nickel having existed in the channel region 605 is gettered away into the source region 705 and the drain region 704, resulting in that the nickel concentration in the channel region 605 is lowered.

After having obtained the layered structure as in FIG. 11, this is processed as in FIG. 8 and FIG. 9 to form the P-channel TFT and the N-channel TFT on one and the same glass substrate.

The process of this example is advantageous in that the nickel concentration in the channel regions that are sensitive to the motion of TFT is lowered, and therefore the negative influence of nickel on the motion of TFT is retarded.

EXAMPLE 9

This is to demonstrate still another modification of Example 1. The mode of example is characterized in that the nickel gettering is effected in two stages.

First is obtained the condition of FIG. 1(D) in the same manner as in Example 1. That is, the layered structure having the amorphous silicon film 107 is obtained as in Example 1.

Figure 12A:
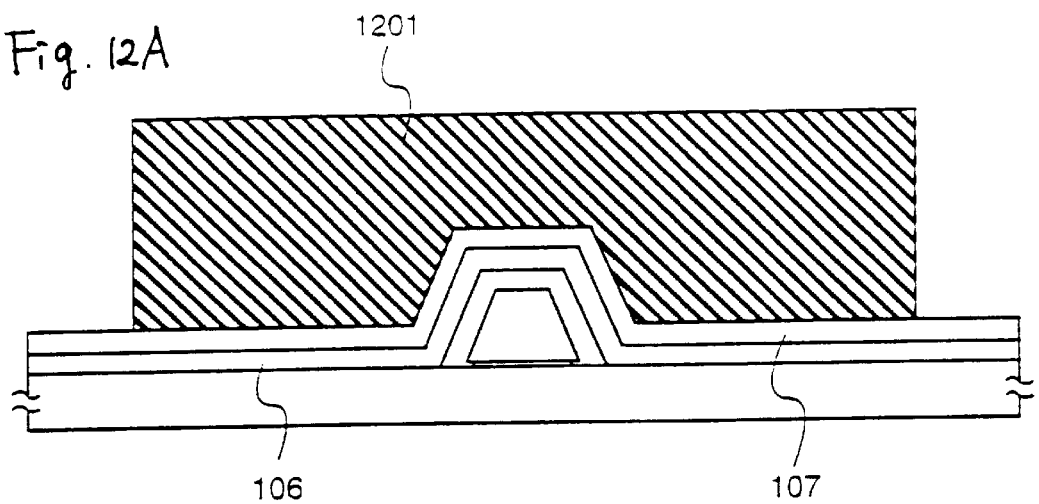
FIG. 12(A) to FIG. 12(C) show a process for producing an N-channel TFT.
Figure 12B:
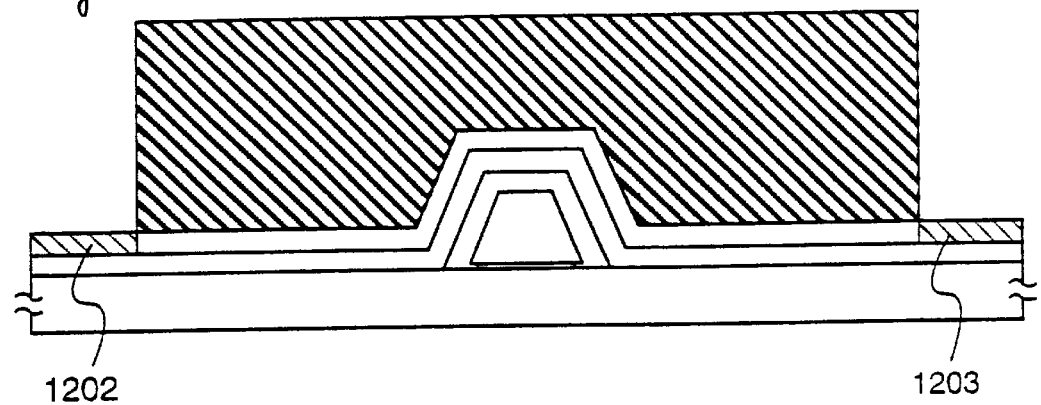

Next, a mask 1201 of a silicon oxide film is formed, as in FIG. 12(A). Then, phosphorus is doped into the regions 1202 and 1203, as in FIG. 12(B).

This phosphorus doping does not participate in the formation of source/drain, but is only for nickel gettering.

Next, the layered structure is heated in a nitrogen atmosphere at 600° C. for 1 hour. In this step, nickel having existed in the region 1204 is gettered away into the regions 1202 and 1203, as in FIG. 12(C). In this step, the heating is effected via the mask 1201 of the silicon oxide film.

Next, the exposed silicon film is etched via the mask 1201 of the silicon oxide film. Thus, the gettering sites 1202 and 1203 are etched off.

As a result of this process, the nickel concentration in the region 1204 (this shall be the active layer of TFT) is reduced.

After this, the region 1204 is processed in the same manner as in Example 1 to produce TFT. For this, referred to are the steps of FIG. 2(A) to FIG. 2(C) and FIG. 3(A) to FIG. 3(D).

Figure 3C:
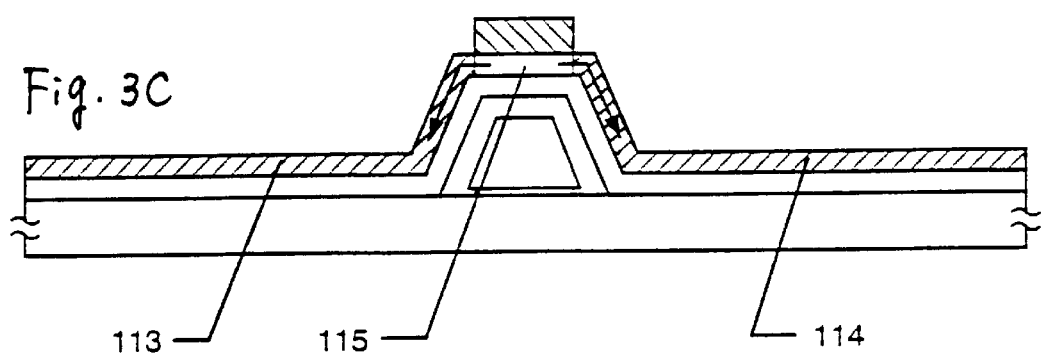
Figure 3D:
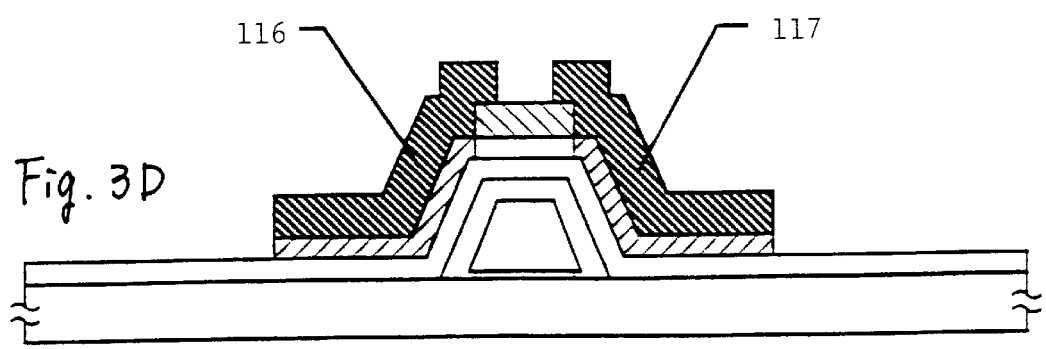
Figure 12C:
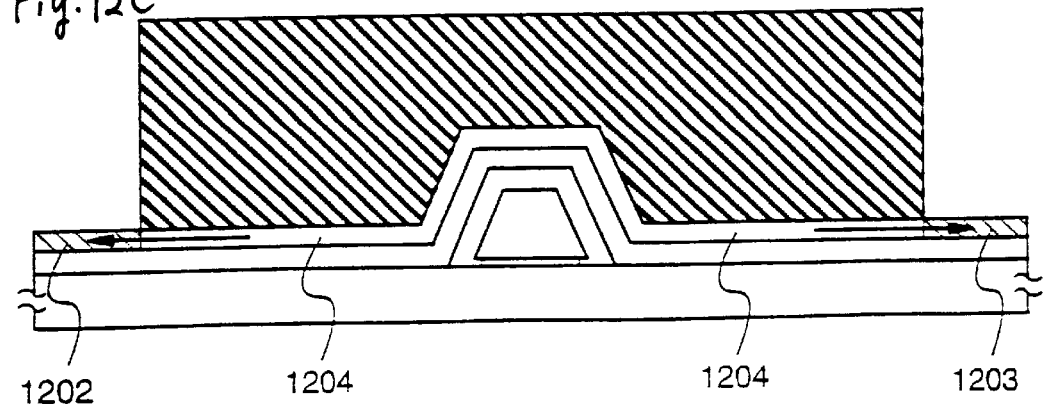

In the process of this example, nickel having existed in the region to be the active layer is gettered away, as in FIG. 12(C), while nickel having existed in the channel-forming region is also gettered away into the source/drain regions as in FIG. 3(C).

In this process, therefore, the negative influence of nickel on TFT is drastically removed.

EXAMPLE 10

This is to demonstrate still another modification of Example 1 or Example 10. In this, the structure of the gate electrode is improved.

In this example, silicon is used as the gate electrode for the N-channel TFT.

First, as in FIG. 14(A), an N-type silicon film is formed on a glass substrate 101 through thermal reduced-pressure CVD, and then patterned into a pattern 1401. This pattern 1401 is to be the gate electrode.

Then, a gate-insulating silicon oxide film 106 is formed over the gate electrode 1401 through thermal reduced-pressure CVD. Further, an amorphous silicon film 107 is formed thereover also through thermal reduced-pressure CVD.

Next, another silicon oxide film 108 is formed over the film 107, and a resist mask 109 is formed through exposure of the back surface of the thus-layered substrate to light. (FIG. 14(A))

Next, a mask 110 of the silicon oxide film is formed below the resist mask 109, as in FIG. 14(B).

Next, the resist mask 109 is removed, and a nickel acetate solution is applied to the layered structure to thereby make nickel kept in contact with the surface of the structure, as so indicated by 111. Thus is obtained the condition of FIG. 14(C).

Figure 15A:
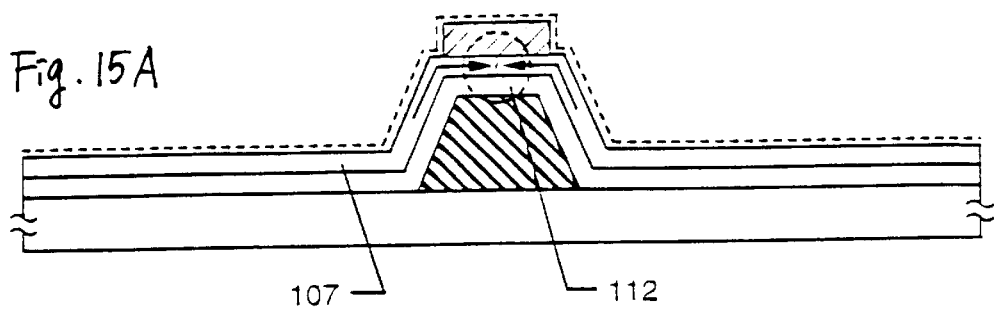
FIG. 15(A) to FIG. 15(D) show a process for producing a TFT.

Next, this is heated to thereby crystallize the amorphous silicon film 107, as in FIG. 15(A). In this step, the layered structure is heated in a nitrogen atmosphere at 630° C. for 4 hours for the intended crystallization.

The upper limit of the heating temperature in this step is defined by the heat-resisting temperature of the glass substrate used, since the gate electrode is made of silicon having high heat resistance.

For example, where a quartz substrate is used herein, the heating temperature may be higher.

Figure 15B:
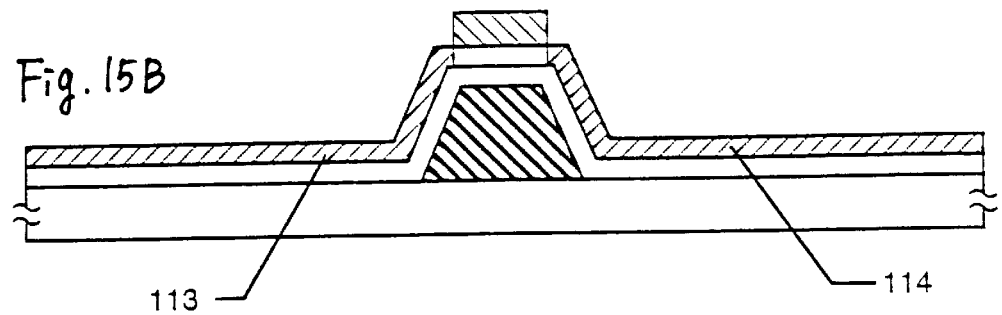

After the crystallization, phosphorus is doped through plasma doping, as in FIG. 15(B). In this step, phosphorus is doped in the regions 113 and 114.

Figure 15C:
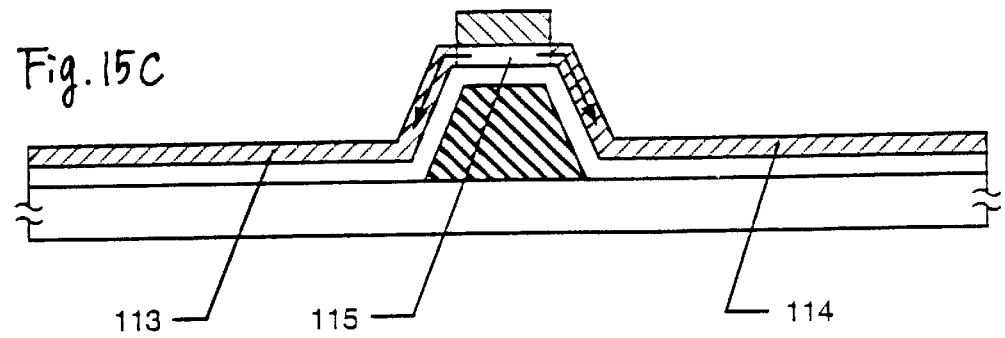

Next, this is again heated in a nitrogen atmosphere at 600° C. for 2 hours. As a result of this heat treatment, nickel having existed in the region 115 is gettered away into the regions 113 and 114. (FIG. 15(C))

Figure 15D:
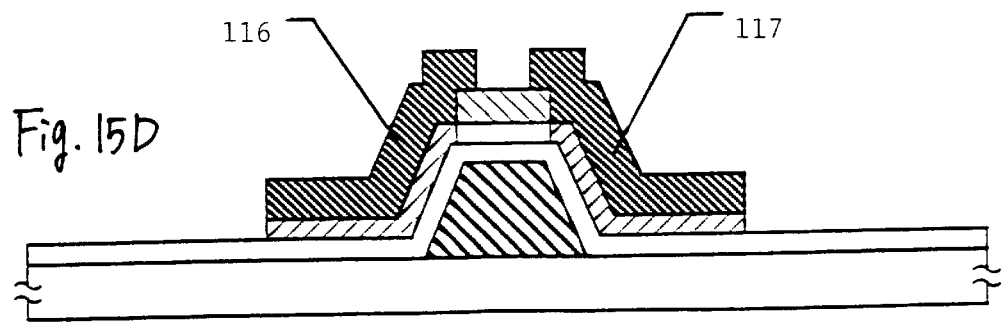

Next, formed are a source electrode 116 and a drain electrode 117. Via those electrodes, the exposed semiconductor region is etched, as in FIG. 15(D).

As the gate electrode, also employable is any of tantalum, laminate of tantalum and tantalum nitride, various silicide materials, and various metal materials.

EXAMPLE 11

Herein shown are examples of various semiconductor devices comprising TFT as produced according to the invention, such as those illustrated in the other examples.

FIG. 13 (A) is a portable, information-processing terminal. The body 2001 of this information-processing terminal is provided with an active-matrix type, liquid crystal display or an active matrix-type, EL display, and with a camera member 2002 through which it takes external information.

The camera member 2002 is provided with an image-receiving part 2003 and a control switch 2004.

It is expected that information-processing terminals will be thinner and more lightweight for enhancing their portability.

Figure 13A:
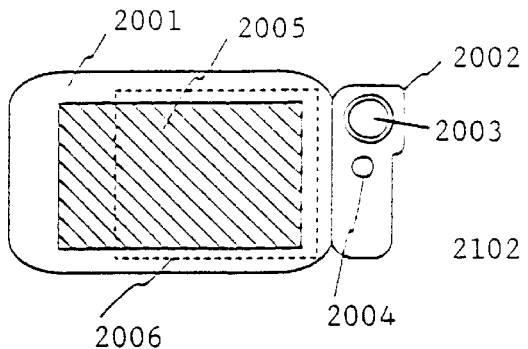
FIG. 13(A) to FIG. 13(F) are graphical views of semiconductor devices comprising TFT.

In the illustrated constitution, it is desirable that the peripheral drive circuit, arithmetic circuit and memory circuit to be on the substrate on which the active-matrix type display 2005 is formed are integrated with TFT. In FIG. 13(A), 2006 is an integrated circuit.

Figure 13B:
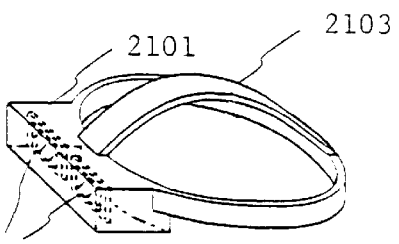

FIG. 13(B) is a head-mount display. Its body 2101 is provided with an active-matrix type, liquid crystal display or EL display 2102. The body 2101 can be mounted on the head with the band 2103.

Figure 13C:
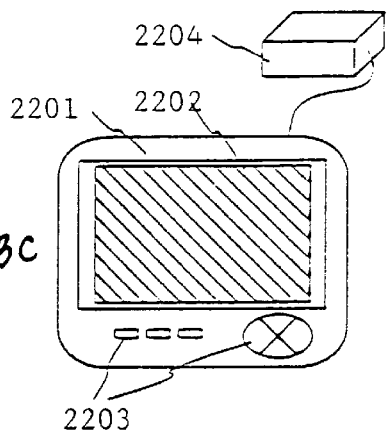

FIG. 13(C) is a car navigation device. Its body 2201 is provided with a liquid crystal display device 2202 and a control switch 2203. The car navigation device of that type has a function of displaying geographic information and the like, in accordance with the signals received by the antenna 2204.

Figure 13D:
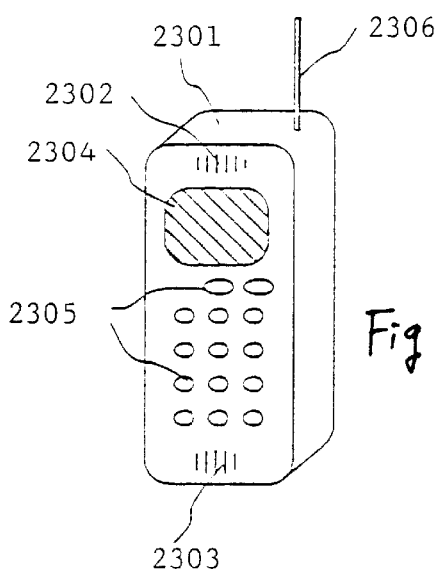

FIG. 13(D) is a portable telephone. Its body 2301 is provided with an active-matrix type, liquid crystal display device 2304, a control switch 2305, a voice-inputting member 2303, a voice-outputting member 2302 and an antenna 2306.

Figure 13E:
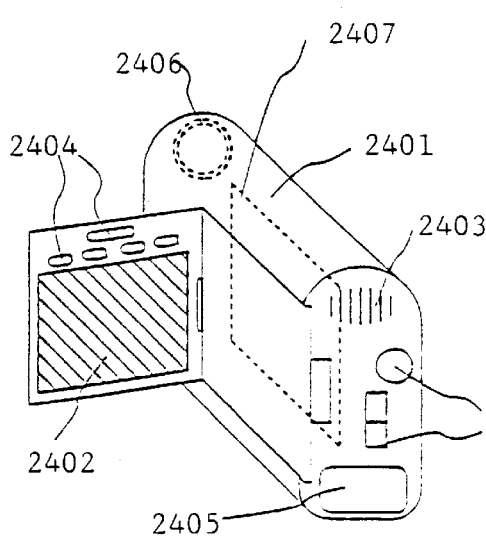

Recently, a combination composed of the portable, information-processing terminal of FIG. 13(A) and the portable telephone of FIG. 13(D) has been commercialized. FIG. 13(E) is a portable video camera. Its body 2401 is provided with an image-receiving member 2406, a voice-inputting member 2403, a control switch 2404, an active-matrix type, liquid crystal display 2402, a battery 2405, and an integrated circuit 2407.

Figure 13F:
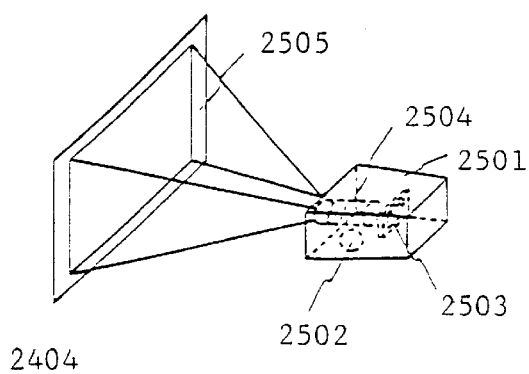

FIG. 13(F) is a projection-type, liquid crystal display device. Its body 2501 is provided with a light source 2502, an active-matrix type, liquid crystal display device 2503, and an optical system 2504. This projection device has a function of displaying images on a screen 2505 positioned outside the device.

The liquid crystal display device to be used in the examples illustrated herein may be any of transmission-type ones or reflection-type ones.

In the devices of FIG. 13(A) to FIG. 13(E), also usable are active-matrix type, EL displays in place of the liquid crystal display devices.

As has been described in detail herein, the present invention disclosed herein provides bottom-gate-type TFT having aluminum electrodes. TFT of the invention are free from the problems with conventional TFT. Concretely, in producing TFT of the invention, the necessary crystallization can be attained under heat, and heating can be effected at any step in the process of producing TFT.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
   a semiconductor layer having at least a source region, a drain region, and a channel-forming region therebetween over a substrate having an insulating surface; and a gate electrode adjacent to the channel-forming region with a gate insulating film interposed therebetween, the gate electrode comprising a lamination of a first conductive layer comprising titanium over the substrate and a second conductive layer on the first conductive layer, wherein the second conductive layer has a larger bottom surface than that of the first conductive layer, and wherein the first conductive layer does not have a tapered cross section, and the second conductive layer has a tapered cross section.

2. A semiconductor device according to claim 1 wherein the second conductive layer comprises aluminum.

3. A semiconductor device according to claim 1 wherein the gate electrode is covered by an oxide film of the second conductive layer.

4. A semiconductor device according to claim 1 wherein the semiconductor layer comprises a material selected from the group consisting of silicon, germanium and a combination thereof.

5. A semiconductor device according to claim 1 wherein the semiconductor device is an EL (electro-luminescence) display device.

6. A semiconductor device according to claim 1 wherein the semiconductor device is one selected from the group consisting of a portable information-processing terminal, a head-mount display, a car navigation device, a portable telephone, a video camera, and a projection type liquid crystal display.

7. A semiconductor device comprising:

a crystalline semiconductor region having at least a source region, a drain region, and a channel-forming region therebetween; and a gate electrode adjacent to the channel-forming region with a gate insulating film interposed therebetween, the gate electrode comprising a lamination of a first conductive layer comprising titanium over a substrate and a second conductive layer on the first conductive layer, wherein the second conductive layer has a larger bottom surface than that of the first conductive layer, and wherein the first conductive layer does not have a tapered cross section, and the second conductive layer has a tapered cross section.

8. A semiconductor device according to claim 7 wherein the second conductive layer comprises aluminum.

9. A semiconductor device according to claim 7 wherein the gate electrode is covered by an oxide film of the second conductive layer.

10. A semiconductor device according to claim 7 wherein the crystalline semiconductor region comprises a material selected from the group consisting of silicon, germanium and a combination thereof.

11. A semiconductor device according to claim 7 wherein the crystalline semiconductor region contains a metal element selected from the group consisting of Ni, Fe, Co, Ru, Rh, Pd, Os, Ir, Pt, Cu, and Au.

12. A semiconductor device according to claim 7 wherein the semiconductor device is an EL (electro-luminescence) display device.

13. A semiconductor device according to claim 7 wherein the semiconductor device is one selected from the group consisting of a portable information-processing terminal, a head-mount display, a car navigation device, a portable telephone, a video camera, and a projection type liquid crystal display.

14. A semiconductor device comprising:

a crystalline semiconductor layer having at least a source region, a drain region, and a channel-forming region therebetween over a substrate having an insulating surface; and a gate electrode adjacent to the channel-forming region with a gate insulating film interposed therebetween, the gate electrode comprising a lamination of a first conductive layer comprising titanium over the substrate and a second conductive layer on the first conductive layer, wherein the second conductive layer has a larger bottom surface than that of the first conductive layer, and wherein the first conductive layer does not have a tapered cross section, and the second conductive layer has a tapered cross section.

15. A semiconductor device according to claim 14 wherein the second conductive layer comprises aluminum.

16. A semiconductor device according to claim 14 wherein the gate electrode is covered by an oxide film of the second conductive layer.

17. A semiconductor device according to claim 14 wherein the crystalline semiconductor layer comprises a material selected from the group consisting of silicon, germanium and a combination thereof.

18. A semiconductor device according to claim 14 wherein the crystalline semiconductor layer contains a metal element selected from the group consisting of Ni, Fe, Co, Ru, Rh, Pd, Os, Ir, Pt, Cu, and Au.

19. A semiconductor device according to claim 14 wherein the semiconductor device is an EL (electro-luminescence) display device.

20. A semiconductor device according to claim 14 wherein the semiconductor device is one selected from the group consisting of a portable information-processing terminal, a head-mount display, a car navigation device, a portable telephone, a video camera, and a projection type liquid crystal display.

21. A semiconductor device comprising:

a gate electrode over a substrate having an insulating surface, the gate electrode comprising a lamination of a first conductive layer comprising titanium over the substrate and a second conductive layer on the first conductive layer; and a semiconductor layer having at least a source region, a drain region, and a channel-forming region over the gate electrode with a gate insulating film interposed therebetween, wherein the second conductive layer has a larger bottom surface than that of the first layer, and wherein the first conductive layer does not have a tapered cross section, and the second conductive layer has a tapered cross section.

22. A semiconductor device according to claim 21 wherein the second conductive layer comprises aluminum.

23. A semiconductor device according to claim 21 wherein the gate electrode is covered by an oxide film of the second conductive layer.

24. A semiconductor device according to claim 21 wherein the semiconductor layer comprises a material selected from the group consisting of silicon, germanium and a combination thereof.

25. A semiconductor device according to claim 21 wherein the semiconductor device is an EL (electro-luminescence) display device.

26. A semiconductor device according to claim 21 wherein the semiconductor device is one selected from the group consisting of a portable information-processing terminal, a head-mount display, a car navigation device, a portable telephone, a video camera, and a projection type liquid crystal display.

27. A semiconductor device comprising:
   a gate electrode over a substrate having an insulating surface, the gate electrode comprising a lamination of a first conductive layer comprising titanium over the substrate and a second conductive layer on the first conductive layer, and
   a crystalline semiconductor layer having at least a source region, a drain region, and a channel-forming region over the gate electrode with a gate insulating film interposed therebetween,
   wherein the second conductive layer has a larger bottom surface than that of the first conductive layer, and
   wherein the first conductive layer does not have a tapered cross section, and the second conductive layer has a tapered cross section.

28. A semiconductor device according to claim 27 wherein the second conductive layer comprises aluminum.

29. A semiconductor device according to claim 27 wherein the gate electrode is covered by an oxide film of the second conductive layer.

30. A semiconductor device according to claim 27 wherein the crystalline semiconductor layer comprises a material selected from the group consisting of silicon, germanium and a combination thereof.

31. A semiconductor device according to claim 27 wherein the crystalline semiconductor layer contains a metal element selected from the group consisting of Ni, Fe, Co, Ru, Rh, Pd, Os, Ir, Pt, Cu, and Au.

32. A semiconductor device according to claim 27 wherein the semiconductor device is an EL (electroluminescence) display device.

33. A semiconductor device according to claim 27 wherein the semiconductor device is one selected from the group consisting of a portable information-processing terminal, a head-mount display, a car navigation device, a portable telephone, a video camera, and a projection type liquid crystal display.

* * * * *

UNITED STATES PATENT AND TRADEMARK OFFICE
CERTIFICATE OF CORRECTION

PATENT NO.    : 6,501,094 B1                                              Page 1 of 1
DATED         : December 31, 2002
INVENTOR(S)   : Shunpei Yamazaki et al.

It is certified that error appears in the above-identified patent and that said Letters Patent is hereby corrected as shown below:

<u>Title page,</u>
Item [56], OTHER PUBLICATIONS,
Please amend the below references as follows:

-- P.H. Robinson et al., "Use of HCl Gettering in Silicon Device Processing", J. Electrochem Soc., vol. 118, No. 1, Jan. 1971, pp. 141-143.
S. Lee et al., "Pd Induced Lateral Crystallization of Amorphous Si Thin Films", Appl. Phys. Lett. Vol. 66, No. 13, Mar. 27, 1995, pp.1671-1673.
C. Hayzelden et al., "In Situ transmission electron microscopy studies of silicide-mediated crystallization of amorphous silicon", Vol. 60, No. 2, pp. 225-227. --

Signed and Sealed this

Tenth Day of June, 2003

JAMES E. ROGAN
*Director of the United States Patent and Trademark Office*